US012641722B2

(12) United States Patent
Kim et al.

(10) Patent No.: US 12,641,722 B2
(45) Date of Patent: May 26, 2026

(54) CIRCUIT BOARD AND SEMICONDUCTOR PACKAGE COMPRISING SAME

(71) Applicant: LG INNOTEK CO., LTD., Seoul (KR)

(72) Inventors: Han Sang Kim, Seoul (KR); Bo Ra Kang, Seoul (KR); Yong Suk Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 229 days.

(21) Appl. No.: 18/699,544

(22) PCT Filed: Sep. 30, 2022

(86) PCT No.: PCT/KR2022/014788
§ 371 (c)(1),
(2) Date: Apr. 8, 2024

(87) PCT Pub. No.: WO2023/059007
PCT Pub. Date: Apr. 13, 2023

(65) Prior Publication Data

US 2024/0407095 A1 Dec. 5, 2024

(30) Foreign Application Priority Data

Oct. 6, 2021 (KR) ........................ 10-2021-0132728

(51) Int. Cl.

| | |
|---|---|
| ***H05K 1/11*** | (2006.01) |
| ***H01L 23/498*** | (2006.01) |
| ***H05K 1/02*** | (2006.01) |

(52) U.S. Cl.
CPC ........ *H05K 1/115* (2013.01); *H01L 23/49822* (2013.01); *H01L 23/49838* (2013.01); *H01L 23/49894* (2013.01); *H05K 1/0256* (2013.01); *H05K 2201/032* (2013.01); *H05K 2201/09563* (2013.01)

(58) Field of Classification Search
CPC ........................................................ H05K 1/115
USPC ........................................................... 174/261
See application file for complete search history.

(56) References Cited

U.S. PATENT DOCUMENTS

| | | | | |
|---|---|---|---|---|
| 9,253,897 | B2 | 2/2016 | Kaneko et al. | |
| 12,101,878 | B2 | 9/2024 | Lee et al. | |
| 2008/0224271 | A1* | 9/2008 | Sogawa ............ | H01L 21/76898 257/E21.597 |

(Continued)

FOREIGN PATENT DOCUMENTS

| | | | |
|---|---|---|---|
| JP | 2008-201117 | A | 9/2008 |
| KR | 10-2011-0038457 | A | 4/2011 |

(Continued)

*Primary Examiner* — Stanley Tso

(74) *Attorney, Agent, or Firm* — Birch, Stewart, Kolasch & Birch, LLP

(57) ABSTRACT

A circuit board according to an embodiment includes a first insulating layer, a coating layer disposed on the first insulating layer, and a circuit pattern layer disposed on the coating layer, wherein the circuit pattern layer includes a first metal layer disposed on the coating layer, and a second metal layer disposed on the first metal layer, wherein the coating layer includes a first functional group bonded to the first insulating layer, and a second functional group bonded to the first metal layer.

14 Claims, 15 Drawing Sheets

(56) References Cited

U.S. PATENT DOCUMENTS

| | | | | |
|---|---|---|---|---|
| 2010/0243311 | A1* | 9/2010 | Niki | H05K 3/422<br>174/266 |
| 2011/0083885 | A1* | 4/2011 | Kim | C23C 18/1651<br>174/257 |
| 2014/0021612 | A1* | 1/2014 | Huang | H01L 21/31105<br>257/751 |
| 2016/0113121 | A1* | 4/2016 | Reddy | C23C 18/30<br>174/257 |
| 2022/0256699 | A1* | 8/2022 | Kim | H05K 1/09 |
| 2022/0297410 | A1* | 9/2022 | Liu | C08F 220/36 |

FOREIGN PATENT DOCUMENTS

| | | | |
|---|---|---|---|
| KR | 10-2015-0007986 | A | 1/2015 |
| KR | 10-2017-0067540 | A | 6/2017 |
| KR | 10-2019-0105428 | A | 9/2019 |
| KR | 10-2021-0000655 | A | 1/2021 |
| KR | 10-2021-0091499 | A | 7/2021 |
| KR | 10-2021-0115486 | A | 9/2021 |

* cited by examiner

【FIG. 1】
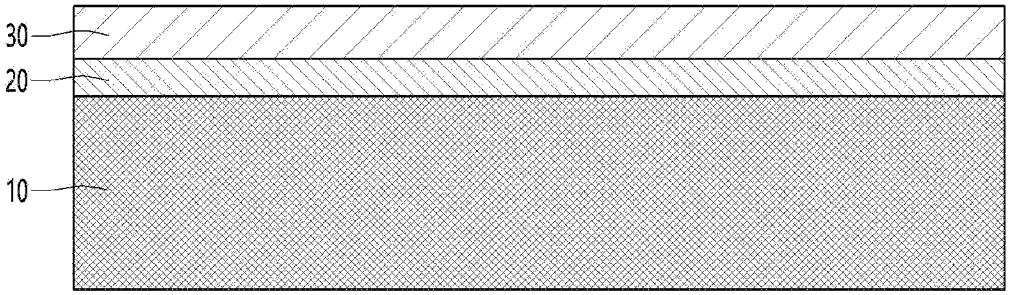
【FIG. 2】
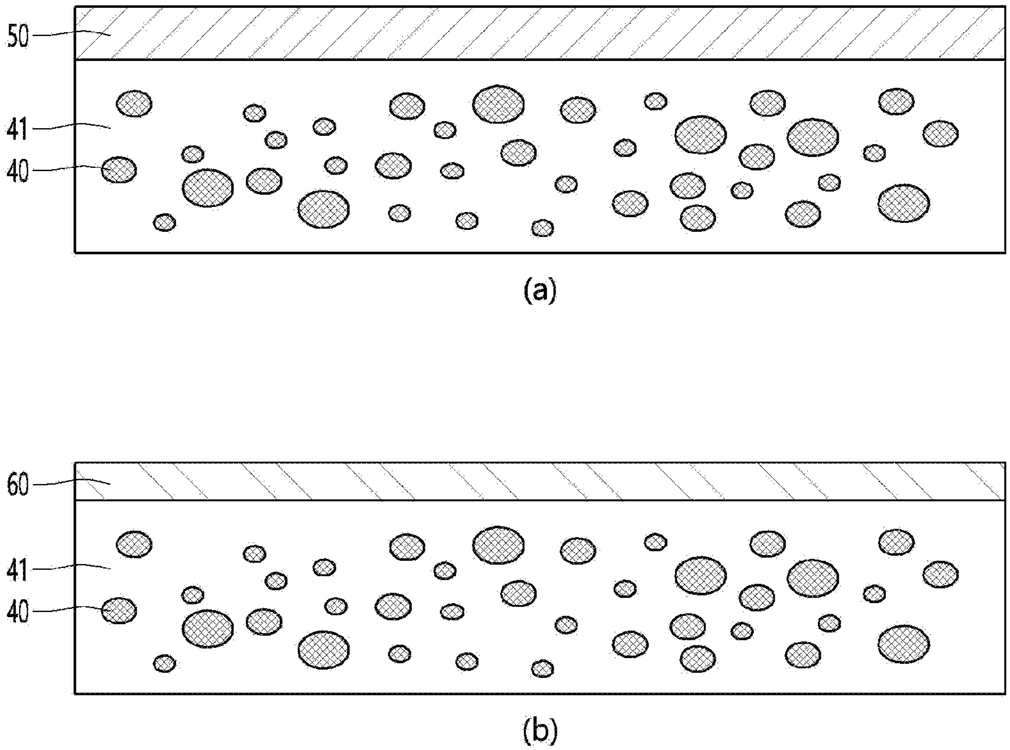

【FIG. 3】
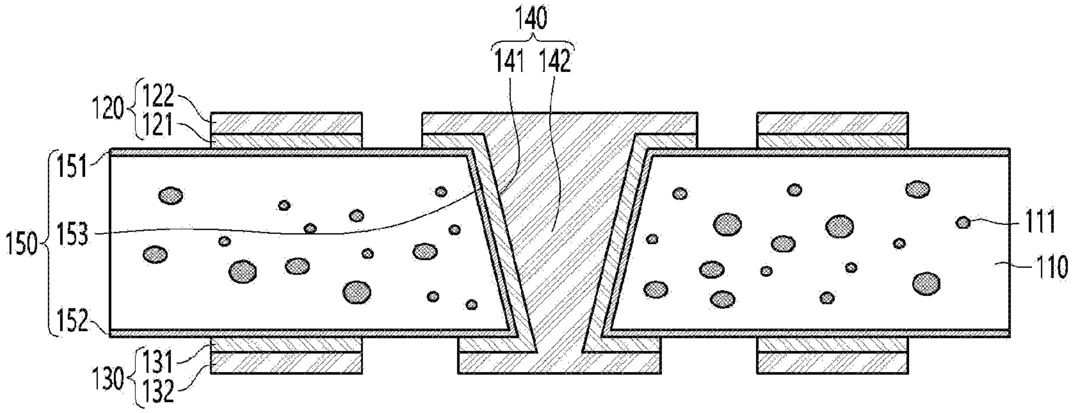
【FIG. 4】
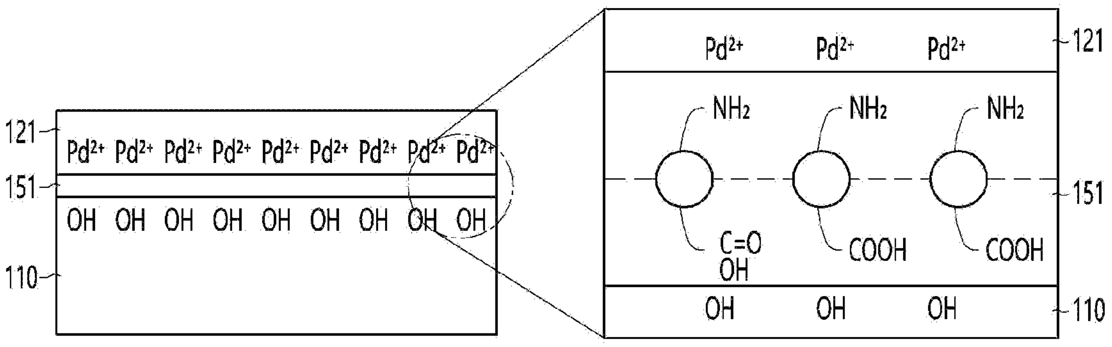

【FIG. 5】
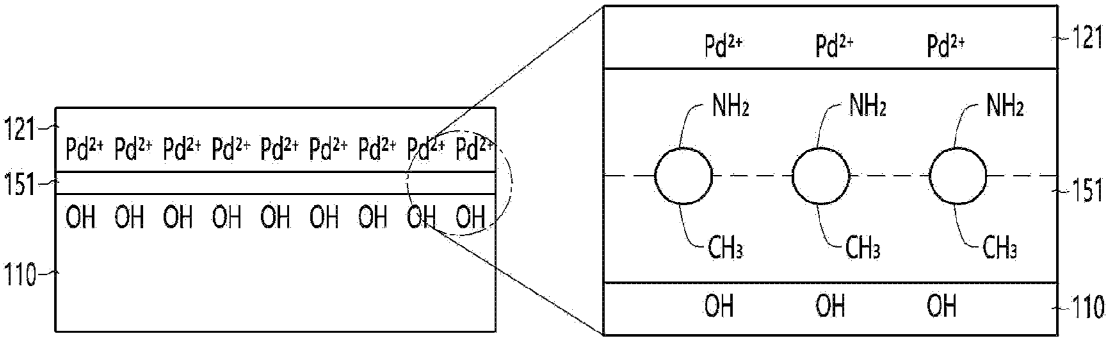
【FIG. 6】
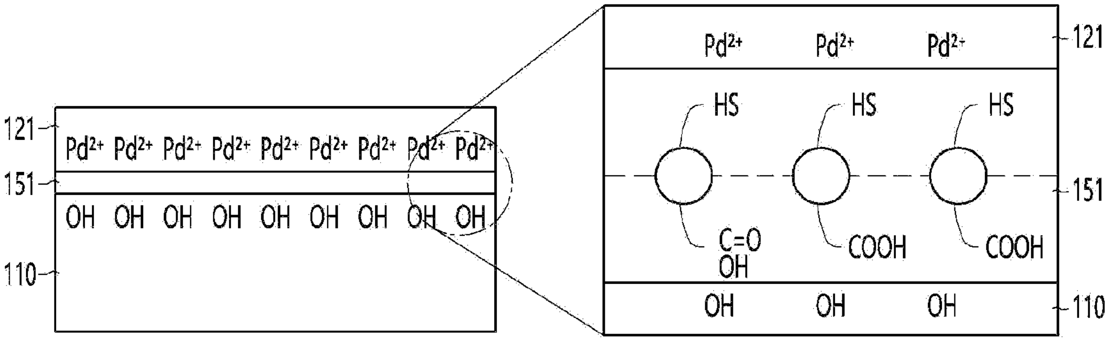

【FIG. 7】
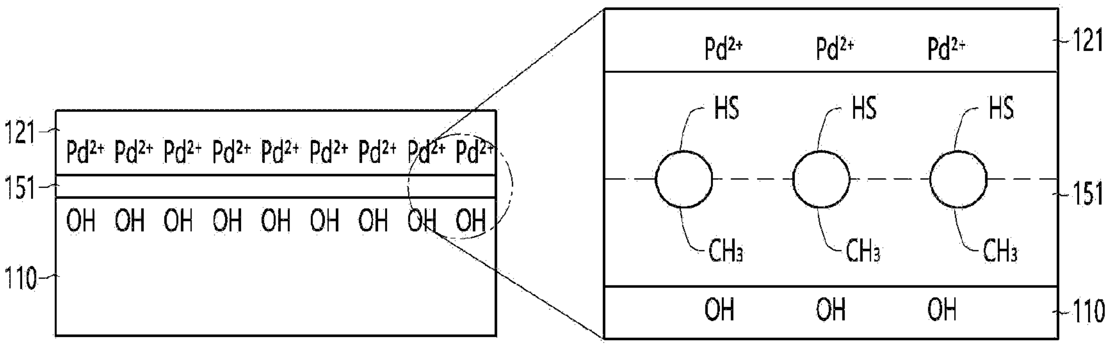

【FIG. 8】
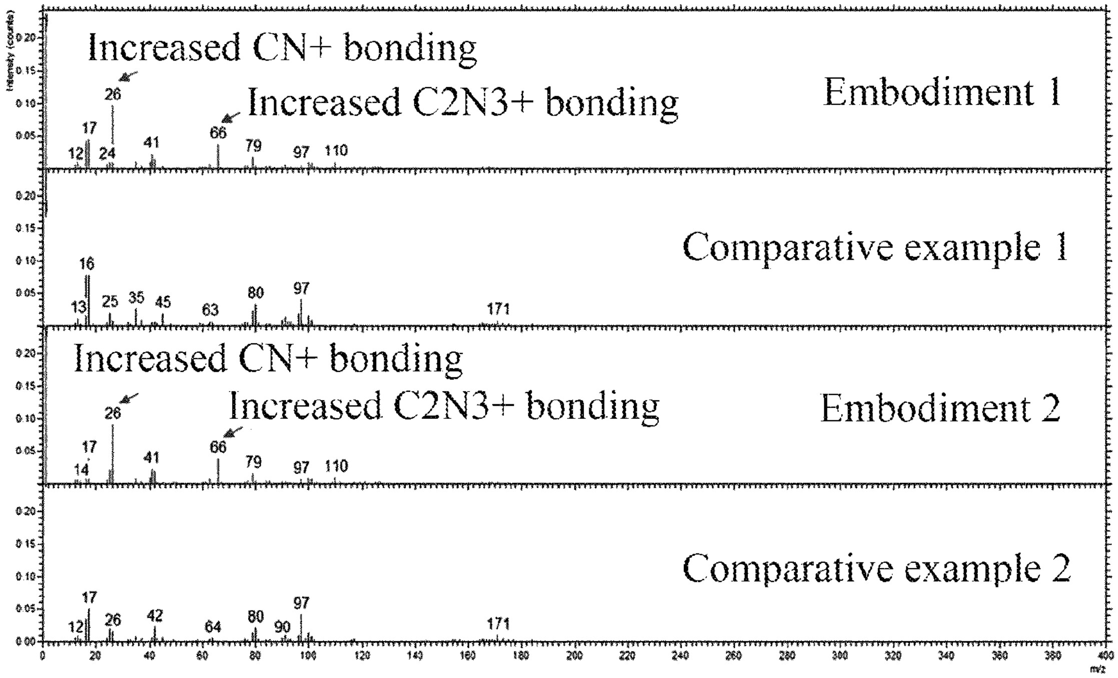
| Elements | Mass(u) |
|---|---|
| CH- | 13 |
| OH- | 17 |
| C2H- | 25 |
| CN- | 26 |
| CHN2- | 41 |
| CNO- | 42 |
| C2N3- | 66 |

【FIG. 9】
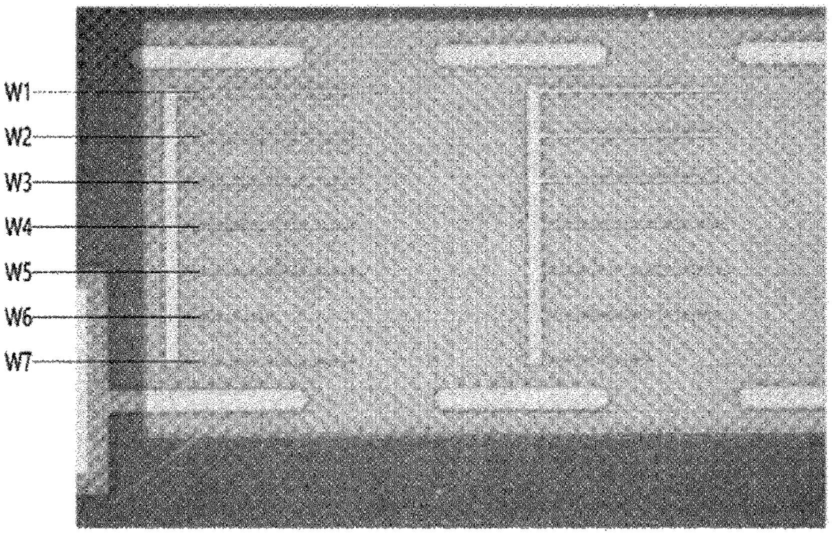
(a)
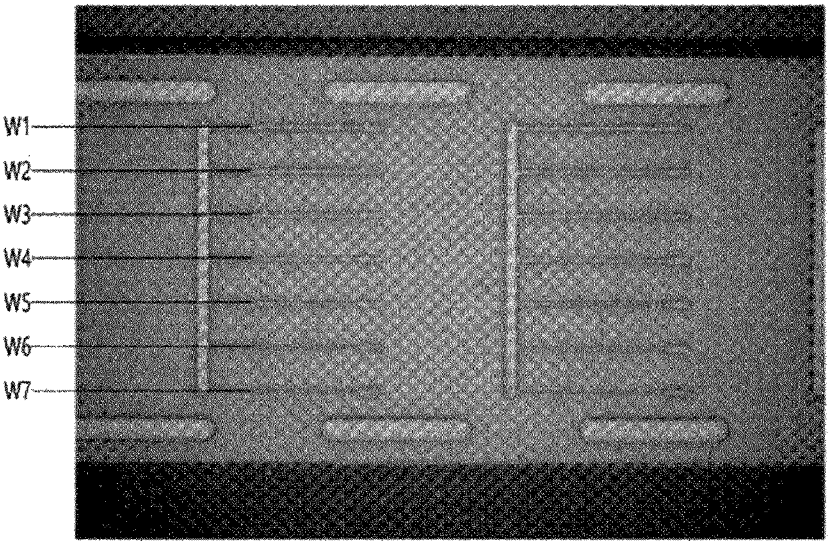
(b)

【FIG. 10】
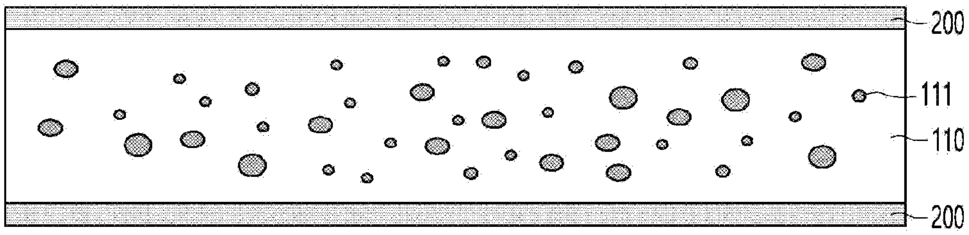
【FIG. 11】
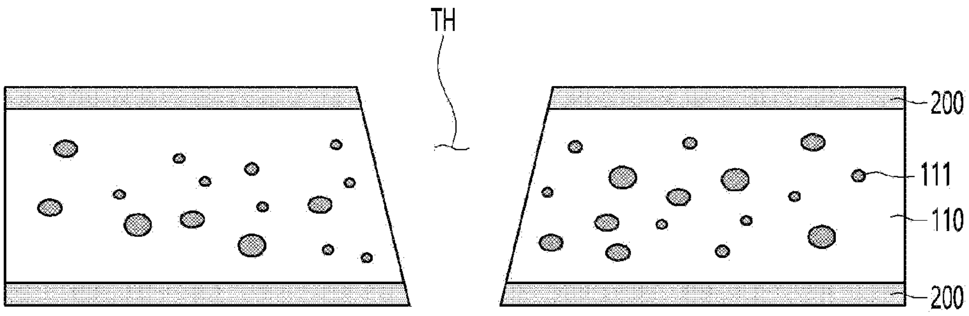

【FIG. 12】
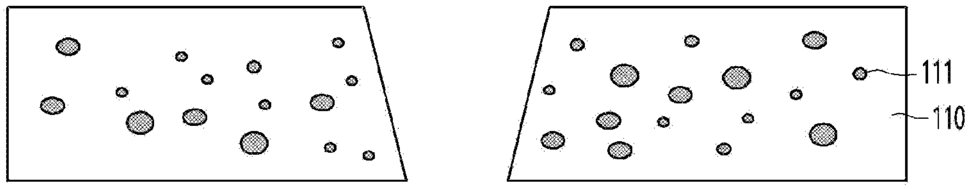
【FIG. 13】
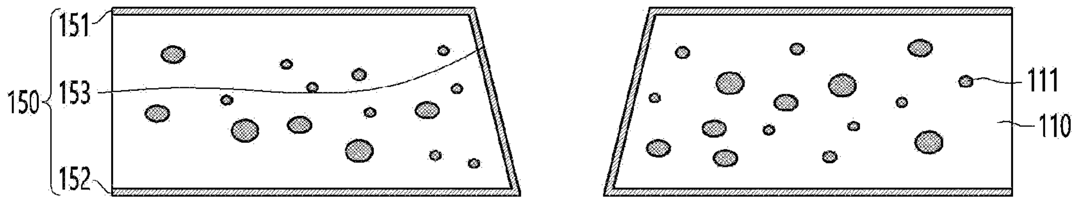

【FIG. 14】
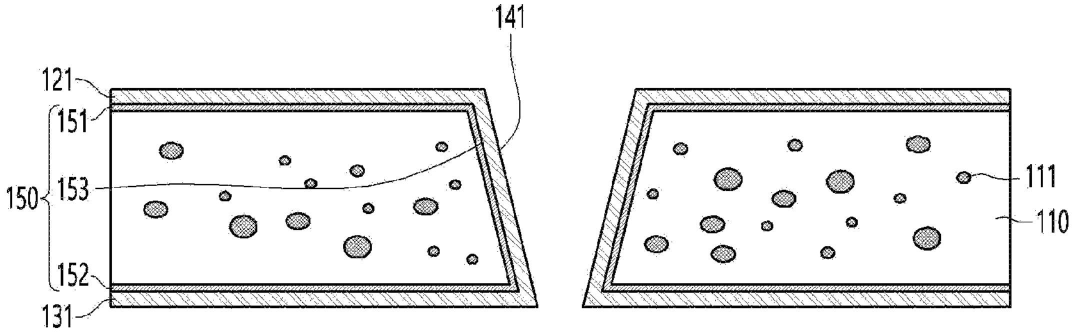
【FIG. 15】
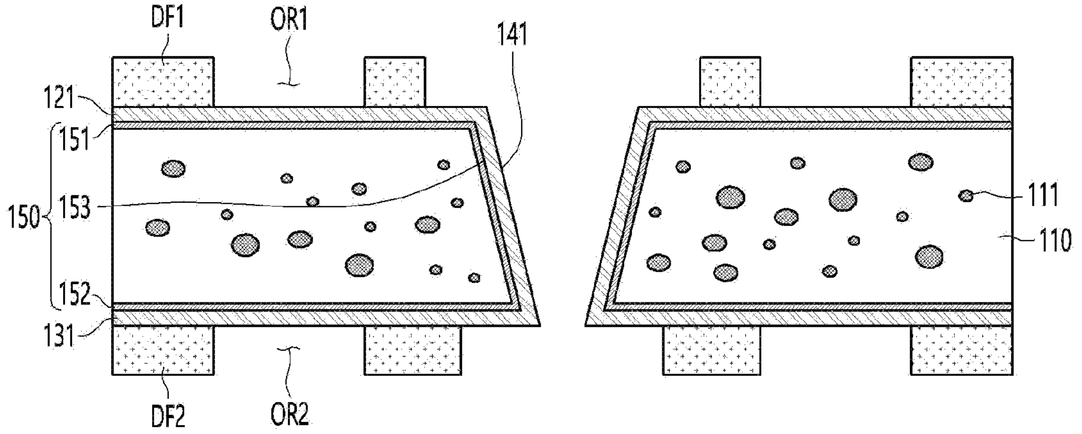

【FIG. 16】
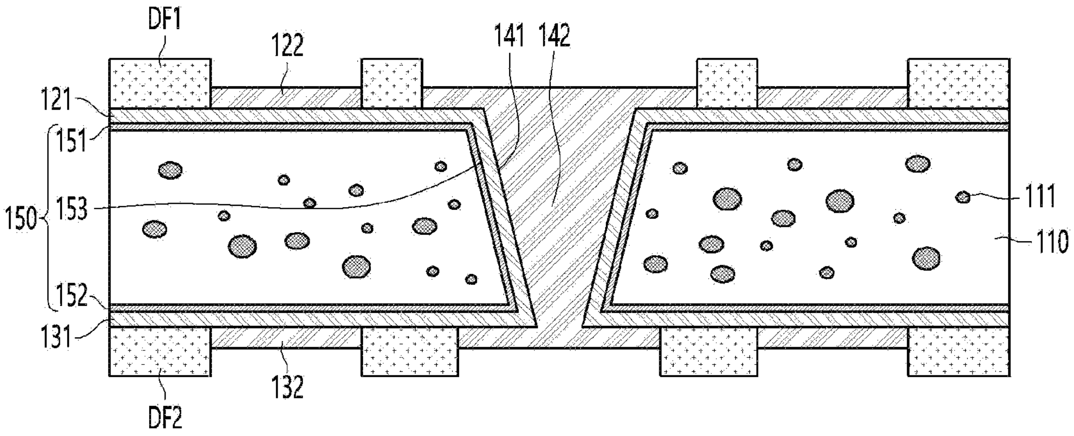
【FIG. 17】
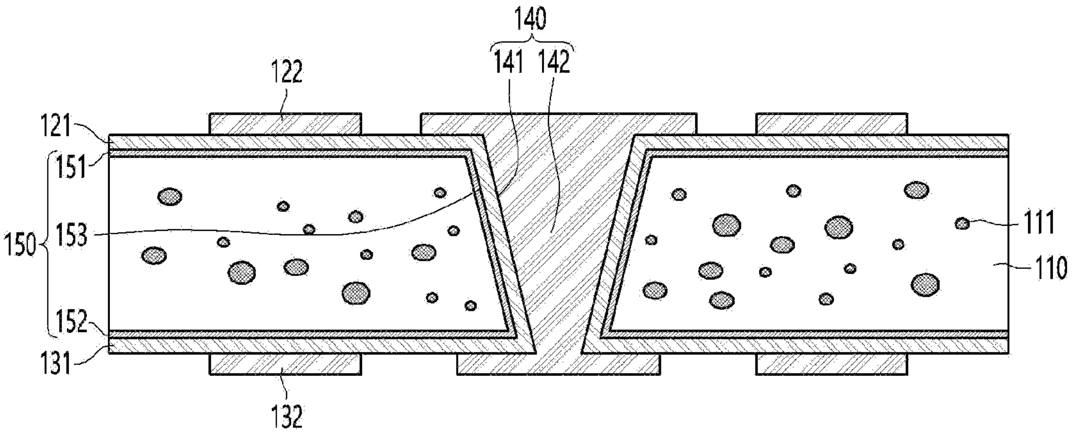

【FIG. 18】
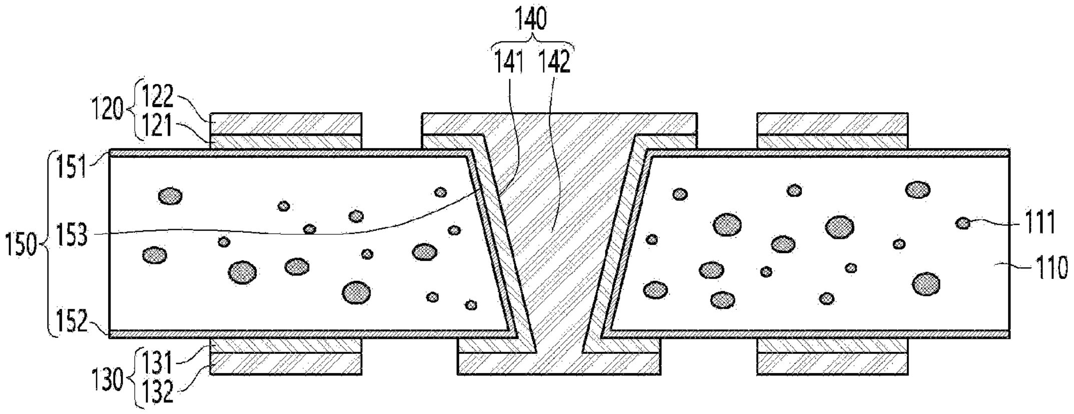

【FIG. 19】
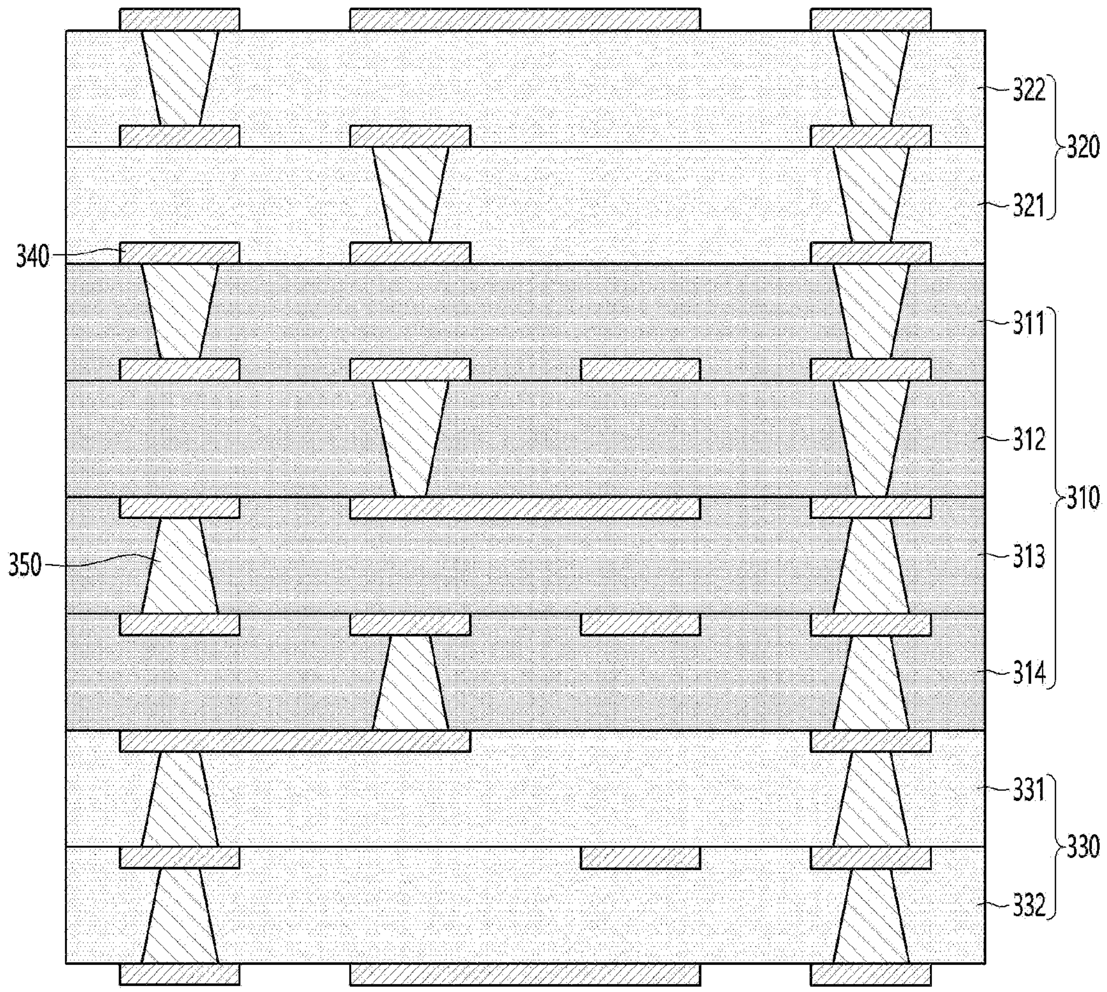

【FIG. 20】
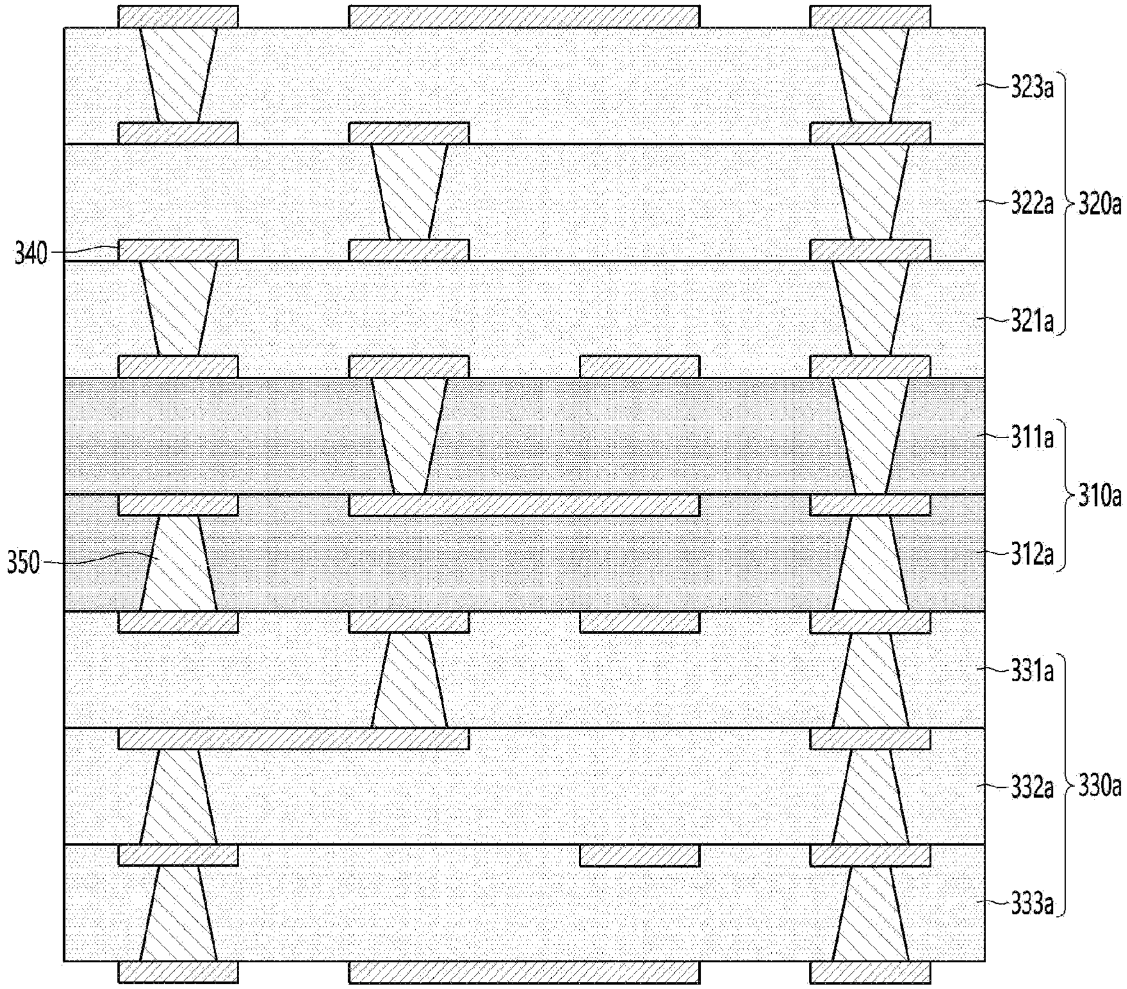

【FIG. 21】
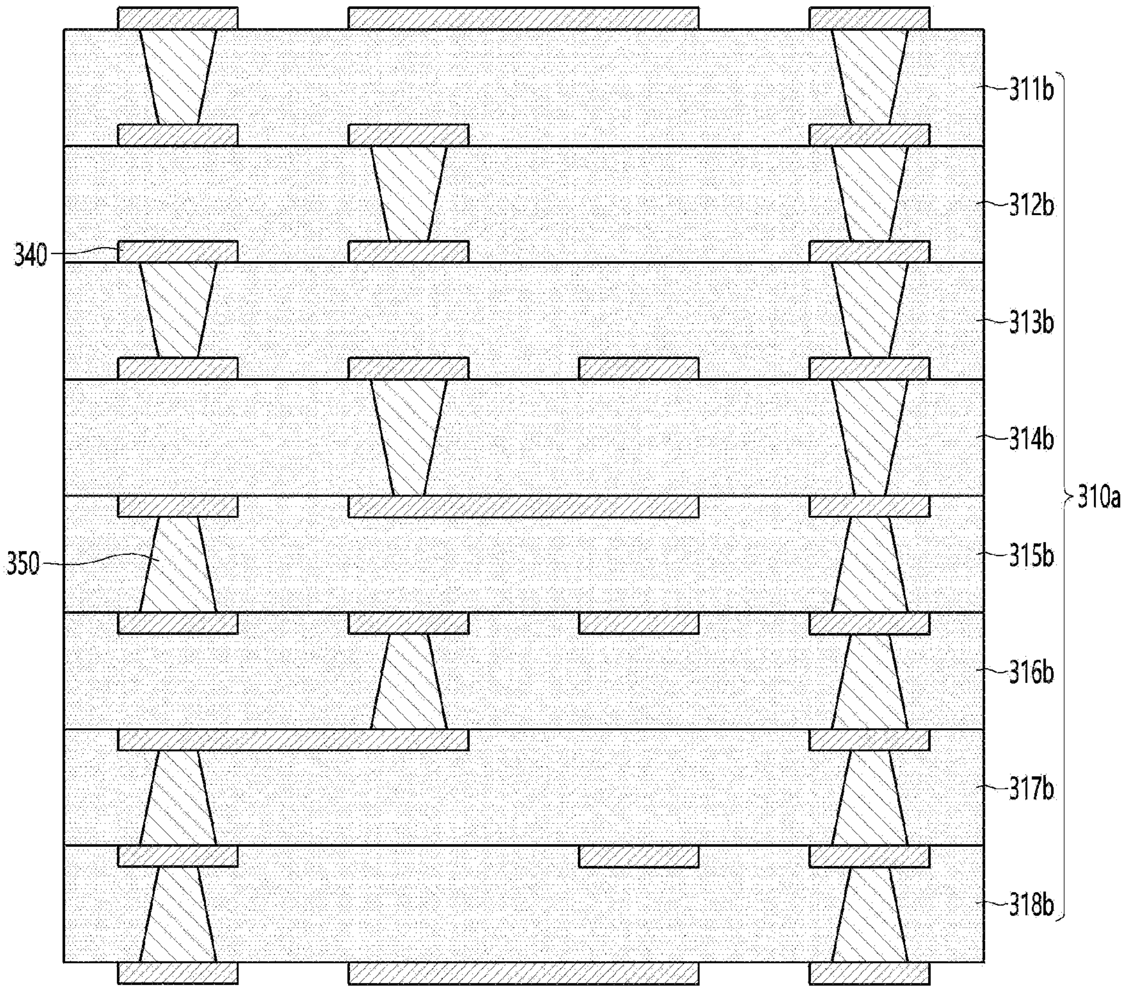

【FIG. 22】
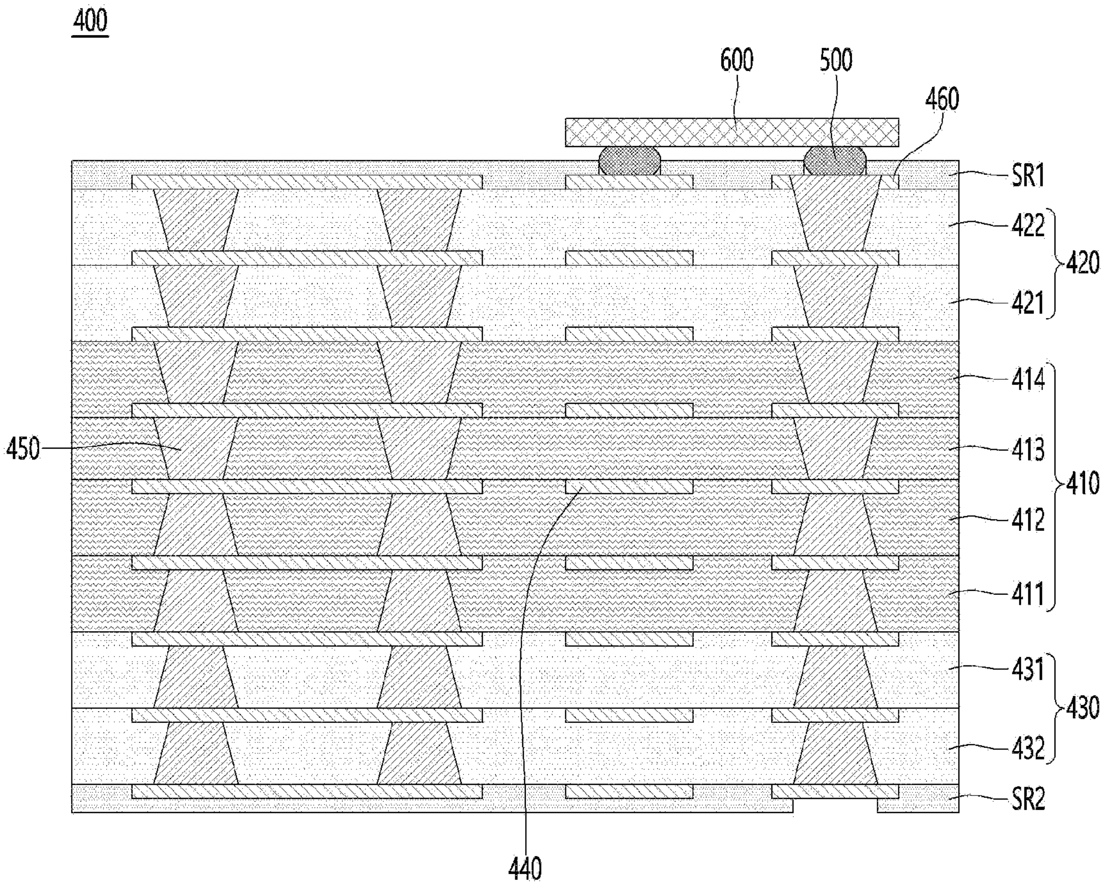

CIRCUIT BOARD AND SEMICONDUCTOR PACKAGE COMPRISING SAME

CROSS REFERENCE TO RELATED APPLICATIONS

This application is the National Phase of PCT International Application No. PCT/KR2022/014788, filed on Sep. 30, 2022, which claims priority under 35 U.S.C. 119(a) to Patent Application No. 10-2021-0132728, filed in the Republic of Korea on Oct. 6, 2021, all of which are hereby expressly incorporated by reference into the present application.

TECHNICAL FIELD

The embodiment relates to a circuit board, and in particular, to a circuit board and semiconductor package comprising the same.

BACKGROUND ART

A printed circuit board (PCB) is formed by printing a circuit line pattern on an electrically insulating substrate with a conductive material such as copper, and refers to a board immediately before mounting electronic components. That is, in order to densely mount many types of electronic devices on a flat plate, it means a circuit board on which a mounting position of each part is determined and a circuit pattern connecting the parts is printed on the flat plate surface and fixed.

Components mounted on the printed circuit board may transmit a signal generated from the component by a circuit pattern connected to each component.

On the other hand, recent portable electronic devices and the like are becoming highly functional, in order to perform high-speed processing of large amounts of information, high-frequency signals are being developed, and accordingly, there is a demand for a circuit pattern of a printed circuit board suitable for high-frequency applications.

The circuit pattern of the printed circuit board should minimize signal transmission loss and enable signal transmission without deteriorating the quality of the high-frequency signal.

The transmission loss of a circuit pattern of a printed circuit board mainly consists of a conductor loss due a metal thin film such as copper and a dielectric loss such as an insulating layer.

The conductor loss due to the metal thin film is related to a surface roughness of the circuit pattern. That is, as the surface roughness of the circuit pattern increases, transmission loss may increase due to a skin effect.

Accordingly, when the surface roughness of the circuit pattern is reduced, there is an effect of preventing a reduction in transmission loss, but there is a problem in that the adhesion between the circuit pattern and the insulating layer is reduced.

In addition, a material having a low dielectric constant may be used as an insulating layer of the circuit board in order to reduce a dielectric constant.

However, in the circuit board for high frequency applications, the insulating layer requires chemical and mechanical properties for use in the circuit board in addition to the low dielectric constant.

In details, it should have isotropy of electrical properties for ease of circuit pattern design and process, low reactivity with metal wiring materials, low ionic conductivity, sufficient mechanical strength to withstand processes such as chemical mechanical polishing (CMP), low moisture absorption, which can prevent delamination or increase in dielectric constant, heat resistance that can overcome the processing temperature, a low coefficient of thermal expansion to eliminate cracking due to temperature change, and furthermore, various conditions such as adhesion, crack resistance, low stress, and low high-temperature gas generation to minimize various stresses and peeling that may be generated at the interface with other materials must be satisfied.

In addition, the insulating layer used in the circuit board for high-frequency applications must satisfy various conditions such as an adhesion property that can minimize various stresses and peeling that can occur at interfaces with other materials (eg, metal thin films), a crack resistance property, a low stress property, a low high-temperature gas generation property.

Accordingly, the insulating layer used in the circuit board for high frequency use preferentially must have low dielectric constant and low thermal expansion coefficient properties, and accordingly, an overall thickness of the circuit board can be reduced.

However, when a circuit board is manufactured using an insulating layer of a low dielectric constant material that is thinner than a threshold, this can cause reliability issues such as warping, cracking, and delamination. In addition, when the number of insulating layers of low dielectric material increases, reliability problems such as warping, cracking and delamination become more severe.

Therefore, there is a need for a method that can implement fine circuit patterns while slimming the circuit board using an insulating layer made of low dielectric material, and can also solve reliability problems such as warping, cracking, and peeling.

DISCLOSURE

Technical Problem

An embodiment provides a circuit board that can be slimmed and a semiconductor package including the same.

Additionally, the embodiment provides a circuit board with improved adhesion between an insulating layer and a circuit pattern layer and a semiconductor package including the same.

The technical problems to be achieved in the proposed embodiment are not limited to the technical problems mentioned above, and other technical problems not mentioned in the embodiments will be clearly understood by those of ordinary skill in the art to which the embodiments proposed from the description below.

Technical Solution

A circuit board according to an embodiment includes a first insulating layer; a coating layer disposed on the first insulating layer; and a circuit pattern layer disposed on the coating layer, wherein the circuit pattern layer includes a first metal layer disposed on the coating layer; and a second metal layer disposed on the first metal layer, wherein the coating layer includes a first functional group bonded to the first insulating layer; and a second functional group bonded to the first metal layer.

In addition, the first functional group of the coating layer is hydrogen bonded with the first insulating layer, and the second functional group of the coating layer is coordinated with the first metal layer.

In addition, the first insulating layer includes a hydroxyl (OH) group, and the first functional group of the coating layer includes at least one of a carboxyl group (COOH) and $CH_3$ bonded to the hydroxyl group.

In addition, the second functional group of the coating layer includes at least one of nitrogen (N) and sulfur (S) coordinated with the first metal layer.

In addition, the first metal layer is an electroless plating layer, and the second metal layer is an electrolytic plating layer formed with the first metal layer as a seed layer.

In addition, the second functional group of the coating layer coordinates with a catalyst metal of the first metal layer.

In addition, the catalyst metal of the first metal layer includes palladium, and at least one of nitrogen (N) and sulfur (S) of the second functional group of the coating layer coordinates with the palladium.

In addition, the first metal layer has a thickness ranging between 1 um and 2.5 um.

In addition, a centerline average roughness value (Ra) of a surface of the first metal layer satisfies a range between 200 nm and 600 nm, and a maximum section height value (Rt) of the surface of the first metal layer satisfies a range between 2 um and 6 um.

In addition, the circuit board further comprises a through electrode disposed in a through hole passing through the first insulating layer, and wherein the coating layer includes a region formed on an inner wall of the through hole, and the through electrode includes a third metal layer disposed on the coating layer of the inner wall of the through hole; and, a fourth metal layer disposed on the third metal layer to fill the through hole.

In addition, the coating layer in contact with the third metal layer of the through electrode includes a first functional group including at least one of a carboxyl group (COOH) and $CH_3$ bonded to a hydroxyl group, and at least one second functional group of nitrogen (N) and sulfur(S) that coordinates with the catalyst metal of the third metal layer.

In addition, the coating layer includes an overlapping region that vertically overlaps the circuit pattern layer; and a non-overlapping region excluding the overlapping regions.

In addition, the circuit board further includes a second insulating layer disposed on the first insulating layer, the overlapping region of the coating layer is in contact with the circuit pattern layer, and the non-overlapping region of the coating layer contacts the second insulating layer.

Meanwhile, the circuit board according to the embodiment includes an insulating layer including through holes; a coating layer disposed on an inner wall of the through hole of the insulating layer; and a through electrode disposed on the coating layer, wherein the through electrode includes a first metal layer disposed on the coating layer; and a second metal layer disposed on the first metal layer and filling the through hole, the coating layer includes a first functional group bonded to the insulating layer; and a second functional group bonded to the first metal layer, and the first functional group of the coating layer is hydrogen bonded to the insulating layer, and the second functional group of the coating layer coordinates with the first metal layer.

In addition, the insulating layer includes a hydroxyl (OH) group, and the first functional group of the coating layer includes at least one of a carboxyl group (COOH) and $CH_3$ bonded to the hydroxyl group.

In addition, the second functional group of the coating layer includes at least one of nitrogen (N) and sulfur (S) that coordinates with a catalyst metal of the first metal layer.

In addition, the first metal layer has a thickness ranging from 1 um to 2.5 um, a centerline average roughness value (Ra) of a surface of the first metal layer satisfies the range between 200 nm and 600 nm, and a maximum section height value (Rt) of a surface of the first metal layer satisfies the range between 2 um and 6 um.

Meanwhile, a semiconductor package according to the embodiment includes an insulating layer including through holes; a coating layer including a first region disposed on an upper surface of the insulating layer and a second region disposed on an inner wall of the through hole; a circuit pattern layer disposed on the insulating layer disposed on the first region of the coating layer; a through electrode disposed on the second region of the coating layer; and a chip mounted on the circuit pattern layer, wherein the circuit pattern layer includes a first metal layer disposed on the first region of the coating layer, and a second metal layer disposed on the first metal layer, the through electrode includes a third metal layer disposed on the second region of the coating layer; and a fourth metal layer is disposed on the third metal layer to fill the through hole, and wherein each of the first region and the second region of the coating layer includes a first functional group including at least one of a carboxyl group (COOH) and $CH_3$ that hydrogen bonds with the hydroxyl group (OH) of the insulating layer, and at least one of nitrogen (N) and sulfur(S) that coordinates with the catalyst metal of the first and third metal layers.

Advantageous Effects

The embodiment includes a coating layer disposed between the insulating layer and the circuit pattern layer. Specifically, the coating layer in the embodiment is disposed between the insulating layer and a first metal layer of the circuit pattern layer. The first metal layer may be a chemical copper plating layer. The coating layer includes a first functional group and a second functional group. The first functional group may be combined with the insulating layer, and the second functional group may be combined with the first metal layer. For example, the first functional group may include a carboxyl group (COOH) or $CH_3$ that combines with the hydroxyl group (OH) of the insulating layer 110. The second functional group includes at least one of nitrogen (N) and sulfur (S) that coordinates with palladium, which is a catalyst metal of the first metal layer. Accordingly, the embodiment can improve adhesion between the insulating layer and the circuit pattern layer by using the coating layer 150. Accordingly, reliability problems such as collapse of the circuit pattern layer or separation from the insulating layer can be solved. Furthermore, a line width of the trace constituting the circuit pattern layer can be further refined by improving the adhesion between the insulating layer and the first metal layer, thereby improving circuit integration.

Additionally, a first metal layer in the embodiment may have a thickness ranging from 1 um to 2.5 um. Preferably, the first metal layer may have a thickness ranging from 1.2 um to 2.3 um. Preferably, the first metal layer may have a thickness ranging from 1.4 um to 2.2 um. Through this, the embodiment can further improve the adhesion between the first metal layer and the insulating layer, and furthermore, the embodiment can improve adhesion between the insulating layer and the circuit pattern layer. Through this, the electrical reliability of the circuit pattern layer in the embodiment can be improved, and thus product satisfaction can be improved. In addition, the embodiment can improve the adhesion between the insulating layer and the circuit pattern layer and refine the line width of the trace constituting the circuit pattern layer. As a result, the circuit integration degree can be increased or the overall volume of the circuit board can be reduced.

Additionally, the centerline average roughness value (Ra) of the insulating layer in the embodiment may range between 200 nm and 600 nm. The centerline average roughness value (Ra) of the insulating layer may be 300 nm to 500 nm. Additionally, the maximum section height value (Rt) of the insulating layer may be 2 um to 6 um. For example, the maximum section height value (Rt) of the insulating layer may be 3 um to 5 um. At this time, the centerline average roughness value (Ra) and maximum section height value (Rt) of the insulating layer may be the centerline average roughness value (Ra) and maximum section height value (Rt) of the surface of the first metal layer in contact with the insulating layer. In an embodiment, the centerline average roughness value (Ra) or maximum section height value (Rt) may be controlled to correspond to the thickness of the first metal layer, and accordingly, the anchoring effect can be further improved as the thickness of the first metal layer increases. Furthermore, the embodiment can improve the plating thickness uniformity of the first metal layer by controlling the centerline average roughness value (Ra) and maximum section height value (Rt). Furthermore, when the first metal layer is etched, a portion of the first metal layer is prevented from remaining on the surface of the insulating layer, thereby improving the electrical reliability of the circuit board and improving the yield of the circuit board.

DESCRIPTION OF DRAWINGS

FIG. 1 is a diagram for explaining a circuit board according to a first comparative example.

FIG. 2 is a diagram for explaining a circuit board according to a second comparative example.

FIG. 3 is a diagram showing a circuit board according to an embodiment.

FIG. 4 is a diagram for explaining a bonding structure of a coating layer according to a first embodiment.

FIG. 5 is a diagram for explaining a bonding structure of a coating layer according to a second embodiment.

FIG. 6 is a diagram for explaining a bonding structure of a coating layer according to a third embodiment.

FIG. 7 is a diagram for explaining a bonding structure of a coating layer according to a fourth embodiment.

FIG. 8 is a diagram showing analysis results of a coating layer according to an embodiment.

FIG. 9 is a diagram for comparing adhesion between an insulating layer and a circuit pattern layer according to comparative examples and embodiments.

FIGS. 10 to 18 are diagrams showing a method of manufacturing a circuit board according to an embodiment in orders of processes.

FIG. 19 is a diagram showing a multilayer circuit board according to a first embodiment.

FIG. 20 is a diagram showing a multilayer circuit board according to a second embodiment.

FIG. 21 is a diagram showing a multilayer circuit board according to a third embodiment.

FIG. 22 is a diagram showing a semiconductor package according to an embodiment.

DETAILED DESCRIPTION OF THE EMBODIMENTS

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and substituted for use.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art.

Further, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence or order of the elements.

In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements.

Further, when expressed as "on (over)" or "under (below)", it may include not only the upper direction but also the lower direction based on one element.

Before explaining the present embodiment, a circuit board according to a comparative example will first be described.

FIG. 1 is a diagram for explaining a circuit board according to a first comparative example, and FIG. 2 is a diagram for explaining a circuit board according to a second comparative example.

Referring to FIG. 1, the circuit board of the first comparative example is manufactured using prepreg as an insulating layer.

For example, the circuit board of the first comparative example includes an insulating layer 10 including prepreg. At this time, the prepreg has a structure in which glass fibers are dispersed inside.

At this time, a base member for manufacturing the circuit board of the first comparative example has a structure in which a primer layer 20 is disposed on an insulating layer 10 and a copper foil layer 30 is laminated on the primer layer 20.

Meanwhile, a method of manufacturing the circuit board includes MSAP (Modified Semi Additive Process) and SAP (Semi Additive Process) methods. The MSAP method proceeds with a process of forming a circuit pattern layer with the copper foil layer 30 laminated, and the SAP method proceeds with the process of forming a circuit pattern layer after removing the copper foil layer 30.

At this time, in the MSAP method, a portion of the circuit pattern layer includes a copper foil layer 30. Accordingly, the MSAP method has limitations in reducing the width or spacing of wires in the circuit pattern layer, and thus has limitations in increasing circuit integration.

Meanwhile, in the case of manufacturing the circuit pattern layer using the SAP method in the first comparative example, a primer layer 20 must be included on the insulating layer 10 to ensure adhesion. Therefore, there is a problem that manufacturing costs increase or the overall thickness of the circuit board increases.

Furthermore, the prepreg used as the insulating layer 10 in the first comparative example contains glass fibers therein, it is difficult to reduce the thickness of the glass fiber. This is because the glass fibers included in the prepreg may come into contact with the circuit pattern layer disposed on the surface of the prepreg when the thickness of the prepreg decreases, resulting in a risk of cracking. Accordingly, when reducing the thickness of the prepreg, the circuit board in the first comparative example may have suffered dielectric breakdown and damage to the circuit pattern layer. Accordingly, the circuit board in the comparative example had a limit in reducing the overall thickness due to the thickness of the glass fibers constituting the prepreg.

Meanwhile, in the second comparative example, RCC (resin coated copper) is used to solve the problem of the first comparative example.

As shown in (a) of FIG. 2, the circuit board of the second comparative example is manufactured using an insulating layer 40 composed of RCC. A filler 41 has a dispersed structure within the insulating layer 40. And, a copper foil layer 50 is attached on the insulating layer 40.

At this time, as shown in (b) of FIG. 2, in the second comparative example, a process of removing the copper foil layer 50 disposed on the insulating layer 40 is first performed to manufacture a circuit board using the RCC.

In the second comparative example, a chemical copper plating layer 60 is formed on the insulating layer 40 from which the copper foil layer 50 has been removed, and electroplating is performed using the chemical copper plating layer 60 as a seed layer to form a circuit pattern layer.

At this time, the chemical copper plating layer 60 in the second comparative example is disposed on the insulating layer 40 from which the copper foil layer 50 has been removed. That is, a lower surface of the chemical copper plating layer 60 is in direct contact with an upper surface of the insulating layer 40. The adhesion between the chemical copper plating layer 60 and the insulating layer 40 is affected by the line width of the trace of the circuit pattern formed using the chemical copper plating layer 60. At this time, if the line width of the trace is 10 um or less, there is a problem in that adhesion between the chemical copper plating layer 60 and the insulating layer 40 is not secured, and thus the trace is separated from the insulating layer 40.

In addition, the chemical copper plating layer 60 in the second comparative example has a thickness of less than 0.9 μm. However, when a thickness of the chemical copper plating layer 60 in the second comparative example is less than 0.9 μm, adhesion between the insulating layer 40 and the chemical copper plating layer 60 is not secured. Accordingly, when a certain force is applied in the trace shearing direction, there is a problem in that the circuit pattern layer disposed on the insulating layer 40 is separated or peeled from the insulating layer 40.

Accordingly, the embodiment uses a coating layer to improve adhesion between the chemical copper plating layer and the insulating layer. Specifically, the embodiment includes a coating layer including a first functional group bonded to the insulating layer and a second functional group bonded to the chemical copper plating layer. Accordingly, the embodiment uses the coating layer to improve adhesion between the chemical copper plating layer and the insulating layer.

In addition, the embodiment increases the thickness of the chemical copper plating layer to improve the adhesion between the chemical copper plating layer and the insulating layer. Furthermore, the embodiment reduces the surface roughness of the insulating layer to minimize signal transmission loss. Furthermore, the embodiment allows one value to be determined depending on at least one of the surface roughness value of the insulating layer and the thickness of the chemical copper plating layer, thereby improving the overall reliability of the circuit board.

Electronic Device

Before describing the embodiment, an electronic device to which the semiconductor package of the embodiment is applied will be briefly described. The electronic device includes a main board (not shown). The main board may be physically and/or electrically connected to various components. For example, the main board may be connected to the semiconductor package of the embodiment. Various semiconductor devices may be mounted on a package substrate. The semiconductor device may include memory chips such as volatile memory (e.g., DRAM), non-volatile memory (e.g., ROM), and flash memory, application processor chips such as a central processor (e.g., CPU), graphics processor (e.g., GPU), antenna chip, digital signal processor, encryption processor, microprocessor, and microcontroller, logic chips such as analog-digital converters and application-specific ICs (ASIC).

In addition, the embodiment provides a circuit board and a semiconductor package that enable the pitch of the pad to be refined and to mount at least two different types of chips on one board according to the refinement of the pitch. Furthermore, the embodiment provides a circuit board and a semiconductor package that allow more traces to be placed between mounting pads having a smaller pitch than the comparative example.

In addition, the electronic device may be a smart phone, a personal digital assistant, a digital video camera, a digital still camera, a vehicle, a high-performance server, a network system, computer, monitor, tablet, laptop, netbook, television, video game, smart watch, automotive, or the like. However, the embodiment is not limited thereto, and may be any other electronic device that processes data in addition to these.

Embodiments

FIG. 3 is a diagram showing a circuit board according to an embodiment, FIG. 4 is a diagram for explaining a bonding structure of a coating layer according to a first embodiment, FIG. 5 is a diagram for explaining a bonding structure of a coating layer according to a second embodiment, FIG. 6 is a diagram for explaining a bonding structure of a coating layer according to a third embodiment, and FIG. 7 is a diagram for explaining a bonding structure of a coating layer according to a fourth embodiment.

Referring to FIGS. 3 to 7, the circuit board provides a mounting space where at least one chip can be mounted. The number of chips mounted on the circuit board may be one, or alternatively, there may be two, and alternatively, there may be three or more. For example, one processor chip may be mounted on the circuit board, and alternatively, at least two processor chips performing different functions may be mounted on the circuit board. Alternatively, one memory chip may be mounted along with one processor chip. Alternatively, at least two processor chips and at least one memory chip performing different functions may be mounted.

The circuit board includes an insulating layer 110.

The insulating layer 110 may be RCC (Resin coated copper).

The insulating layer 110 may include a resin and a filler 111 dispersed in the resin. The insulating layer 110 may be a resin for a semiconductor package. The embodiment allows the dielectric constant of the insulating layer 110 to be lowered to 3.2 Dk or less through a change in the content of the composition in the insulating layer 110 constituting the resin for the semiconductor package. Preferably, the embodiment allows the dielectric constant of the insulating layer 110 to be lowered to 3.0 Dk or less through a change in the content of the composition in the insulating layer 110 constituting the resin for the semiconductor package. More preferably, the embodiment allows the dielectric constant of the insulating layer 110 to satisfy a range of 2.9 Dk to 3.2 Dk through a change in the content of the composition in the insulating layer 110 constituting the resin for the semiconductor package.

The insulating layer 110 is a composite of a resin and a filler 111. The insulating layer 110 may have a specific third dielectric constant due to a combination of a first dielectric constant of the resin and a second dielectric constant of the filler 111. In addition, the third dielectric constant may satisfy a range of 2.9 Dk to 3.2 Dk. Accordingly, the insulating layer 110 in the embodiment can be applied to a circuit board suitable for high frequency applications. Accordingly, the embodiment can minimize signal loss by the insulating layer 110 and solve the problem of exposing the filler 111 to the surface of the resin, and accordingly, the embodiment allows for improved reliability.

The resin may have a low dielectric constant. In this case, Table 1 shows a type of general resin and a dielectric constant according to the type of resin.

TABLE 1

| | material | | | | |
|---|---|---|---|---|---|
| | Phenolic | Epoxy | Maleimide or modify epoxy | Cyanate | PTFE |
| dielectric constant (Dk) | 4.5~6.5 | 3.5~5.0 | 2.3~2.5 | 2.6~3.0 | 2.2 |

As described above, the resin may include various materials. In this case, the resin including phenolic, general epoxy, and cyanate has a dielectric constant (Dk) of 2.6 or more. In addition, the resin including PTFE has a low dielectric constant of about 2.2 Dk, but a high process temperature condition is required. For example, a resin generally requires a process temperature of 250° C., but the PTFE requires a process temperature of 300° C. or more. In addition, the PTFE requires a bonding sheet during the lamination process to manufacture a multi-layered circuit board, which increases the overall thickness of the circuit board, causing problems in slimming the circuit board. Accordingly, the embodiment allows the dielectric constant of the resin of the insulating layer 110 to be lowered by using a modified epoxy or a maleimide series. However, the embodiment is not limited thereto, and the dielectric constant may be made including general epoxy or cyanate. In addition, the filler 111 may have a certain level of dielectric constant. For example, the filler 111 may be formed of a ceramic filler. In this case, Table 2 shows the dielectric constant according to the type of ceramic filler.

TABLE 2

| material | $SiO_2$ | $Al_2O_3$ | $ZrO_3$ | $HfO_2$ | $TiO_2$ |
|---|---|---|---|---|---|
| dielectric constant (Dk) | 3.7~4.2 | 9.0 | 3.7~4.2 | 3.7~4.2 | 3.7.2 |

As described above, when the filler 111 is formed of $Al_2O_3$, the dielectric constant of the filler 111 is about 9.0 Dk, and accordingly, there is a limit to lowering the dielectric constant of the insulating layer 110, which is a composite of resin and filler, to 3.2 Dk or less only with the dielectric constant of the resin. Therefore, in the embodiment, the filler 111 is constructed using any one of $SiO_2$, $ZrO_3$, $HfO_2$, and $TiO_2$. Accordingly, the filler 111 may have a dielectric constant in a range of 3.7 to 4.2 Dk. On the other hand, the filler 111 can be divided into a plurality of groups based on a diameter. For example, the filler 111 may be divided into at least three groups based on their diameters. For example, the filler 111 may include a first filler group having a first diameter range, a second filler group having a second diameter range smaller than the first diameter range, and a third filler group having a third diameter range smaller than the second diameter range. Specifically, the filler 212 includes a first filler group having a first diameter, a second filler group having a second diameter smaller than the first diameter, and a third filler group having a third diameter smaller than the second diameter. In addition, the first diameter of the first filler group may satisfy the first diameter range. Also, the second diameter of the second filler group may satisfy the second diameter range. Also, the third diameter of the third filler group may satisfy the third diameter range. In the embodiment, when dispersing the filler 111 in the resin, the filler 111 is divided into at least three filler groups based on different diameter ranges, and the at least three filler groups are dispersed in the resin. Accordingly, the embodiment allows the insulating layer 110 to have a certain level of strength or higher while allowing the insulating layer 110 to have a low dielectric constant of 2.9 to 3.2 Dk. Furthermore, the embodiment minimizes the exposure of the filler 111 after de-smearing under the condition that the insulating layer 110 has the dielectric constant and strength within the above range, thereby minimizing migration growth.

In addition, the insulating layer 110 in the embodiment may have a coefficient of thermal expansion of 30 to 42 ppm.

To this end, the filler 111 may have a high content in the insulating layer 110. For example, a content of the filler 111 in the insulating layer 110 in the embodiment may be 68 wt % to 76 wt %. When the content of the filler 111 in the insulating layer 110 is smaller than 68 wt %, the insulating layer 110 may not have a certain level of strength or higher and may not have a coefficient of thermal expansion within the above range. In addition, when the content of the filler 111 in the insulating layer 110 is greater than 76 wt %, the insulating layer 110 may not have a low dielectric constant.

Therefore, the embodiment allows the filler 111 in the insulating layer 110 to satisfy a range of 65 wt % to 76 wt %. Meanwhile, in the embodiment, the fillers 112 may be divided into a plurality of groups having different diameter ranges. Also, a plurality of groups of the filler 111 may have different contents.

For example, the filler 111 may be divided into at least three filler groups having different diameter ranges. Specifically, the filler 111 may include a first filler group having a first diameter range. The first diameter range of the first filler group may be 2 μm to 3.5 μm. A diameter of the first filler group may be greater than a diameter of other filler groups constituting the filler 111. For example, the first filler group may have a greatest diameter range among diameter ranges of at least three filler groups included in the filler 111. The filler 111 may include a second filler group having a second diameter range. The second diameter range of the second filler group may be 1 μm to 2 μm. The second filler group may be a filler group having a greatest content among filler groups constituting the filler 111. For example, the second filler group may include fillers having a medium diameter range among a plurality of filler groups constituting the filler 111. In addition, the second filler group having the medium diameter range may have a greatest content among the contents of each of the plurality of filler groups constituting the filler 111. The filler 111 may include a third filler group having a third diameter range.

The third diameter range of the third filler group may be 0.5 μm to 1 μm. The third filler group of the first embodiment may include fillers with a smallest diameter range among a plurality of filler groups constituting the filler 111. The third filler group may control a direction of resin flow in the insulating layer 110 while maintaining the dielectric constant that the insulating layer 110 should have within the content range of the filler 111.

For example, the filler 111 as described above includes a first filler group 112*a*, a second filler group 112*b*, and a third filler group 112*c*. In this case, the resin flow between the filler 111 including the plurality of filler groups may be regular. For example, the first filler group in the embodiment has a greatest diameter range. Accordingly, the second filler group and the third filler group having a smaller diameter may be disposed between the fillers constituting the first filler group 112*a*. Therefore, in the embodiment, the resin flow may be performed along the second filler group and the third filler group between the first filler group having the greatest diameter in a state where the filler 111 including a plurality of filler groups as described above is provided.

The embodiment allows the first filler group to be included in the filler 111 in a range of 5 wt % to 20 wt %. When the content of the first filler group is less than 5 wt %, the insulating layer 110 may not have a certain level of rigidity. In addition, when the content of the first filler group is greater than 20 wt %, it may cause a problem that the filler is exposed to the surface of the insulating layer 110 in the de-smear process due to the increase in the content of the first filler group 112*a*. In addition, it can cause migration growth.

In addition, the embodiment allow the second filler group to be included in the filler 111 in a range of 60 wt % to 80 wt %. When the content of the second filler group is less than 60 wt %, the insulating layer 110 may not have a certain level of rigidity. In addition, when the content of the second filler group is greater than 80 wt %, the insulating layer 110 may not satisfy the required low dielectric constant. In addition, when the content of the second filler group is greater than 80 wt %, it may cause a problem that the filler is exposed to the surface of the insulating layer 110 in the de-smear process.

In addition, the embodiment allows the third filler group to have a content of 10 wt % to 30 wt % in the filler 111. When the content of the third filler group is less than 10 wt %, the content of the first filler group or the second filler group should be increased by the decrease in the content of the third filler group 112*c*, and accordingly, a reliability problem may occur. In addition, when the content of the third filler group is greater than 30 wt %, resin flowability may decrease as the content of the third filler group increases.

The insulating layer 110 may have a thickness ranging from 10 μm to 30 μm. For example, the insulating layer 110 may have a thickness ranging from 15 μm to 25 μm.

Meanwhile, although it has been described above that the filler 111 in the insulating layer 110 is divided into at least three groups according to diameter, the present invention is not limited thereto. For example, the diameters of the fillers 111 included in the insulating layer 110 may all be the same, or alternatively, they may be divided into two groups depending on the diameters.

A circuit pattern layer may be disposed on a surface of the insulating layer 110 in the embodiment.

For example, a first circuit pattern layer 120 may be disposed on an upper surface of the insulating layer 110. Additionally, a second circuit pattern layer 130 may be disposed on a lower surface of the insulating layer 110.

The first circuit pattern layer 120 and the second circuit pattern layer 130 may be formed using a semi-additive process (SAP) method.

The first circuit pattern layer 120 and the second circuit pattern layer 130 may include traces and pads, respectively.

At this time, a line width of each trace of the first circuit pattern layer 120 and the second circuit pattern layer 130 may satisfy a range of 2 μm to 15 μm. For example, a line width of each trace of the first circuit pattern layer 120 and the second circuit pattern layer 130 may satisfy a range of 2.2 μm to 12 μm. For example, a width of each trace of the first circuit pattern layer 120 and the second circuit pattern layer 130 may satisfy a range of 2.5 μm to 10 μm.

Preferably, the traces of the first circuit pattern layer 120 and the second circuit pattern layer 130 may be fine patterns having a line width in a range of 2.5 μm to 10 μm.

Accordingly, the embodiment forms a coating layer 150 between the insulating layer 110 and the first circuit pattern layer 120, and between the insulating layer 40 and the second circuit pattern layer 130. As a result, the adhesion between the insulating layer 40 and the first circuit pattern layer 120 and the second circuit pattern layer 130 can be improved.

In addition, the traces of the first circuit pattern layer 120 and the second circuit pattern layer 130 may be fine patterns having a line width of 10 μm or less. In addition, the embodiment may control the thickness of each first metal layer of the first circuit pattern layer 120 and the second circuit pattern layer 130 and a surface roughness value of the insulating layer 110, which will be described below, and therefore, it is possible to improve the adhesion between the insulating layer 110 and the first circuit pattern layer 120 and the second circuit pattern layer 130.

The first circuit pattern layer 120 and the second circuit pattern layer 130 may be formed of at least one metal material selected from among gold (Au), silver (Ag), platinum (Pt), titanium (Ti), tin (Sn), copper (Cu), and zinc (Zn). In addition, the first circuit pattern layer 120 and the second circuit pattern layer 130 may be formed of paste or solder paste including at least one metal material selected from among gold (Au), silver (Ag), platinum (Pt), titanium (Ti), tin (Sn), copper (Cu), and zinc (Zn), which are excellent in bonding force. Preferably, the first circuit pattern layer 120 and the second circuit pattern layer 130 may be formed of copper (Cu) having high electrical conductivity and a relatively low cost.

The first circuit pattern layer 120 and the second circuit pattern layer 130 may have a thickness ranging from 5 μm to 20 μm. For example, the first circuit pattern layer 120 and the second circuit pattern layer 130 may have a thickness ranging from 6 μm to 17 μm. The first circuit pattern layer 120 and the second circuit pattern layer 130 may have a thickness ranging from 7 μm to 13 μm. When the thickness of the first circuit pattern layer 120 and the second circuit pattern layer 130 is less than 5 μm, resistance may increase. If the thickness of the first circuit pattern layer 120 and the second circuit pattern layer 130 exceeds 20 μm, it may be difficult to refine the trace.

Meanwhile, the first circuit pattern layer 120 and the second circuit pattern layer 130 may each have a plurality of layer structures.

For example, the first circuit pattern layer 120 may include a first metal layer 121 and a second metal layer 122. Correspondingly, the second circuit pattern layer 130 may include a first metal layer 131 and a second metal layer 132. At this time, the first circuit pattern layer 120 and the second circuit pattern layer 130 have substantially the same layer structure, and hereinafter, the description will be based on the layer structure of the first circuit pattern layer 120.

The first circuit pattern layer 120 may include a first metal layer 121 disposed on an upper surface of the insulating layer 110. The first metal layer 121 may be an electroless plating layer. Preferably, the first metal layer 121 may be a chemical copper plating layer.

layer 120. For example, a ratio of a total thickness of the first circuit pattern layer 120 to a thickness of the first metal layer 121 may satisfy a range of 2 to 20 times. The thickness of the first metal layer 121 may satisfy a range of 6% to 100% of the thickness of the second metal layer 122. For example, the ratio of the thickness of the second metal layer 122 to the thickness of the first metal layer 121 may satisfy a range of 1 to 19 times.

Specifically, the first metal layer 121 may have a thickness ranging from 1 μm to 2.5 μm. Preferably, the first metal layer 121 may have a thickness ranging from 1.2 μm to 2.3 μm. Preferably, the first metal layer 121 may have a thickness ranging from 1.4 μm to 2.2 μm.

If the thickness of the first metal layer 121 is less than 1 μm, a size of the plating particles constituting the first metal layer 121 is small, and accordingly, the adhesion between the insulating layer 110 and the first metal layer 121 may be reduced. Additionally, if the adhesion between the first metal layer 121 and the insulating layer 110 decreases, a problem may occur in which the first circuit pattern layer 120 is separated into the insulating layer 110.

If the thickness of the first metal layer 121 is greater than 2.5 μm, it may be difficult to miniaturize the first circuit pattern layer 120. For example, if the thickness of the first metal layer 121 is greater than 2.5 μm, it may be difficult to form the line width of the trace of the first circuit pattern layer 120 to 10 μm or less.

In the embodiment, the thickness of the first metal layer 121 is increased compared to the comparative example, and thus the adhesion between the insulating layer 110 and the first metal layer 121 can be improved.

Hereinafter, the difference in adhesion that appears according to the difference in plating thickness of the first metal layer between the comparative example and the embodiment will be explained.

TABLE 3

| Line width of the trace | Adhesion (trace shear, gf) 5 μm | 7 μm | 9 μm | 11 μm | 13 μm | 15 μm | 17 μm |
|---|---|---|---|---|---|---|---|
| comparative example | 6.06 | 7.92 | 10.59 | 13.40 | 14.84 | 17.26 | 19.32 |
| embodiment 1 (1.1 μm) | 6.9 | 8.5 | 11.4 | 14.3 | 15.95 | 18.99 | 21.01 |
| embodiment 2 (1.5 μm) | 7.25 | 9.5 | 12.05 | 14.87 | 17.30 | 20.22 | 22.30 |
| improvement(%) in embodiment 2 | 19.8% | 17.3% | 12.3% | 10.6% | 14.2% | 14.9% | 14.1% |
| embodiment 3 (1.9 μm) | 8.46 | 10.65 | 13.20 | 16.26 | 19.05 | 22.40 | 24.77 |
| Improvement(%) in embodiment 3 | 39.6% | 34.5% | 24.6% | 21.3% | 28.4% | 29.8% | 28.2% |

The first circuit pattern layer 120 may include a second metal layer 122 disposed on the first metal layer 121. The second metal layer 122 may be an electrolytic plating layer. For example, the second metal layer 122 may be a layer formed by electrolytic plating using the first metal layer 121 as a seed layer.

A thickness of the first metal layer 121 may satisfy a range of 10% to 100% of a line width of the trace of the first circuit pattern layer 120. For example, a ratio of a line width of the trace of the first circuit pattern layer 120 to a thickness of the first metal layer 121 may satisfy a range of 1 to 10 times. The thickness of the first metal layer 121 may satisfy a range of 5% to 50% of a total thickness of the first circuit pattern Referring to Table 3, in the embodiment, the thickness of the first metal layer 121 corresponding to the chemical copper plating layer increases compared to the comparative example, and accordingly, it was confirmed that the adhesion between the first metal layer 121 and the insulating layer 110 increased. In particular, in the embodiment e, when the line width of the trace of the first circuit pattern layer 120 was 10 μm or less, it was confirmed that the adhesion between the first metal layer 121 and the insulating layer 110 was further improved compared to the comparative example.

Meanwhile, in order to further improve the adhesion between the first metal layer 121 and the upper surface of the insulating layer 110, it is preferable that the surface roughness value of the upper surface of the insulating layer 110 is determined based on the thickness of the first metal layer 121.

For example, a centerline average roughness value (Ra) of the insulating layer 110 may be 12% to 50% of a thickness of the first metal layer 121.

For example, the centerline average roughness value (Ra) of the upper surface of the insulating layer 110 may range between 200 nm and 600 nm. For example, the centerline average roughness value (Ra) of the upper surface of the insulating layer 110 may be 300 nm to 500 nm.

If the centerline average roughness value (Ra) of the upper surface of the insulating layer 110 is less than 200 nm, the anchoring effect that can be expected when plating the first metal layer 121 on the insulating layer 110 may be reduced.

In addition, if the centerline average roughness value (Ra) of the upper surface of the insulating layer 110 exceeds 600 nm, the centerline average roughness value (Ra) of the upper surface of the insulating layer 110 is great, so the first metal layer 121 cannot be formed with a uniform thickness on the upper surface of the insulating layer 110. Accordingly, the adhesion between the insulating layer 110 and the first metal layer 121 may decrease. Furthermore, if the centerline average roughness value (Ra) of the upper surface of the insulating layer 110 is greater than 600 nm, a problem may occur in which the first metal layer 121 remains between the roughness of the upper surface of the insulating layer 110 in a process of etching the first metal layer 121 on the insulating layer 110, and the remaining metal may cause electrical reliability problems such as circuit shorts. Furthermore, if the centerline average roughness value (Ra) of the upper surface of the insulating layer 110 is greater than 600 nm, signal transmission loss may increase due to skin effect.

Preferably, the maximum section height value (Rt) of the upper surface of the insulating layer 110 may satisfy a range between 80% and 600% of the thickness of the first metal layer 121.

For example, the maximum section height value (Rt) of the upper surface of the insulating layer 110 may be 2 μm to 6 μm. For example, the maximum section height value (Rt) of the upper surface of the insulating layer 110 may be 3 μm to 5 μm.

For example, if the maximum section height value (Rt) of the upper surface of the insulating layer 110 is less than 2 μm, the anchoring effect that can be expected when plating the first metal layer 121 on the insulating layer 110 may be reduced.

In addition, if the maximum section height value (Rt) of the upper surface of the insulating layer 110 exceeds 6 um, the maximum section height value (Rt) of the upper surface of the insulating layer 110 is large, so the first metal layer 121 cannot be formed with a uniform thickness on the upper surface of the insulating layer 110. Accordingly, the adhesion between the insulating layer 110 and the first metal layer 121 may decrease. Furthermore, if the maximum section height value (Rt) of the upper surface of the insulating layer 110 is greater than 6 um, a problem may occur in which the first metal layer 121 remains between the roughness of the upper surface of the insulating layer 110 in the process of etching the first metal layer 121 on the insulating layer 110, and the remaining metal may cause electrical reliability problems such as circuit shorts. Furthermore, if the maximum section height value (Rt) of the upper surface of the insulating layer 110 is greater than 6 um, signal transmission loss may increase due to skin effect.

Meanwhile, a thickness range of the first metal layer 131 of the second circuit pattern layer 130 may also same as the thickness range of the first metal layer 121 of the first circuit pattern layer 120. Additionally, a centerline average roughness value (Ra) and/or maximum section height value (Rt) of the lower surface of the insulating layer 110 may same as the centerline average roughness value (Ra) and/or maximum section height value (Rt) of the upper surface of the insulating layer 110.

Meanwhile, the centerline average roughness value (Ra) and maximum section height value (Rt) of the upper surface of the insulating layer 110 can correspond to centerline average roughness value (Ra) and maximum section height value (Rt) of the lower surface of the first metal layer 121 in contact with the upper surface of the insulating layer 110.

Additionally, the adhesion between the insulating layer and the first metal layer 121 according to the centerline average roughness value (Ra) and maximum section height value (Rt) as described above is shown in Table 4 below.

TABLE 4

| | Adhesion (Trace shear, gf) | | |
|---|---|---|---|
| Linewidth of the trace (9 um) / | Ra: 300 nm Rt: 3 um | Ra: 400 nm Rt: 4 um | Ra: 500 nm Rt: 5 um |
| Thickness of first metal layer: 1.0 um | 9.10 | 10.60 | 12.30 |
| Thickness of first metal layer: 1.5 um | 10.90 | 12.10 | 13.50 |
| Thickness of first metal layer: 1.9 um | 11.80 | 13.20 | 14.80 |

As shown in Table 4, the embodiment can control the centerline average roughness value (Ra) and the maximum section height value (Rt) of the surface of the insulating layer 110 or the first metal layer 121 to correspond to the thickness of the first metal layer 121, as a result, it was confirmed that the adhesion was further improved. Meanwhile, a through electrode 140 may be formed within the insulating layer 110. The through electrode 140 may passes through the insulating layer 110. For example, the through electrode 140 may electrically connect the first circuit pattern layer 120 and the second circuit pattern layer 130. For example, an upper surface of the through electrode 140 may be connected to the first circuit pattern layer 120, and a lower surface of the through electrode 140 may be connected to the second circuit pattern layer 130.

The through electrode 140 can be formed by forming a through hole (not shown) passing through the insulating layer 110 and filling the inside of the formed through hole with a conductive material.

In this case, the through hole may be formed by any one of mechanical, laser, and chemical processing. When the via hole is formed by machining, it can be formed using methods such as milling, drilling, and routing. When the via hole is formed by laser processing, it can be formed using methods such as UV or $CO_2$ laser. When the via hole is formed by chemical processing, it can be formed using a chemical containing amino silane, ketones, or the like.

Meanwhile, the laser processing is a cutting method that concentrates optical energy on a surface to melt and evaporate a part of the material to take a desired shape, accordingly, complex formations by computer programs can be easily processed, and even composite materials that are difficult to cut by other methods can be processed.

In addition, the laser processing has a cutting diameter of at least 0.005 mm, and has a wide range of possible thicknesses.

As the laser processing drill, it is preferable to use a YAG (Yttrium Aluminum Garnet) laser, a $CO_2$ laser, or an ultraviolet (UV) laser. YAG laser is a laser that can process both copper foil layers and insulating layers, and CO2 laser is a laser that can process only insulating layers.

When the through hole is formed, the through part 140 of the embodiment may be formed by filling the inside of the through hole with a conductive material. The metal material forming the through part 140 may be any one material selected from copper (Cu), silver (Ag), tin (Sn), gold (Au), nickel (Ni), and palladium (Pd). In addition, the conductive material filling may use any one or a combination of electroless plating, electrolytic plating, screen printing, sputtering, evaporation, ink-jetting and dispensing.

Meanwhile, the through electrode 140 may include a first metal layer 141 and a second metal layer 142.

The first metal layer 141 of the through electrode 140 may correspond to the first metal layer 121 of the first circuit pattern layer 120, and the second metal layer 142 of the through electrode 140 may correspond to the second metal layer 122 of the first circuit pattern layer 120.

Accordingly, the first metal layer 141 of the through electrode 140 can satisfy a thickness ranging from 1 um to 2.5 um. Preferably, the first metal layer 141 of the through electrode 140 may satisfy a thickness ranging from 1.2 um to 2.3 um. Preferably, the first metal layer 141 of the through electrode 140 may satisfy a thickness ranging from 1.4 um to 2.2 um.

Additionally, a centerline average roughness value (Ra) of an inner wall of the through hole of the insulating layer 110 may range between 200 nm and 600 nm. For example, the centerline average roughness value (Ra) of the inner wall of the through hole of the insulating layer 110 may be 300 nm to 500 nm.

Additionally, the maximum section height value (Rt) of the inner wall of the through hole of the insulating layer 110 may be 2 um to 6 um. For example, the maximum section height value (Rt) of the inner wall of the through hole of the insulating layer 110 may be 3 um to 5 um.

Meanwhile, in the embodiment, a coating layer 150 is disposed between the insulating layer 110 and the circuit pattern layers.

The coating layer 150 includes a first coating layer 151 disposed on an upper surface of the insulating layer 110, a second coating layer 152 disposed on a lower surface of the insulating layer 110, and a third coating layer 153 disposed on an inner wall of a through hole of the insulating layer 110.

The first coating layer 151 may be disposed between the insulating layer 110 and a first circuit pattern layer 120.

A planar area of the first coating layer 151 may be larger than a planar area of the first circuit pattern layer 120. Through this, the first coating layer 151 may include an overlapping region that vertically overlaps the first circuit pattern layer 120 and a non-overlapping region other than the overlapping region. For example, the overlapping region of the first coating layer 151 may contact the lower surface of the first metal layer 121 of the first circuit pattern layer 120. Additionally, the non-overlapping region of the first coating layer 151 may not vertically overlap the first circuit pattern layer 120. For example, the first coating layer 151 may be formed entirely on the upper surface of the insulating layer 110. The first coating layer 151 may function to improve adhesion between the first circuit pattern layer 120 and the insulating layer 110. For example, the first coating layer 151 includes a first functional group and a second functional group. The first functional group of the first coating layer 150 is combined with the insulating layer 110, and the second functional group of the first coating layer 151 may be combined with the first metal layer 121 of the first circuit pattern layer 120. Through this, the first coating layer 151 can improve adhesion between the insulating layer 110 and the first circuit pattern layer 120. Meanwhile, when the circuit board of the embodiment has a multi-layer structure, an additional upper insulating layer (not shown) may be disposed on the upper surface of the insulating layer 110. In addition, the non-overlapping region (a region not in contact with the first circuit pattern layer) of the first coating layer 151 may be combined with the upper insulating layer. Through this, adhesion between the insulating layer 110 and the upper insulating layer can be improved.

Correspondingly, a planar area of the second coating layer 152 may be larger than a planar area of the second circuit pattern layer 130. Through this, the second coating layer 152 may include an overlapping region that vertically overlaps the second circuit pattern layer 130 and a non-overlapping region other than the overlapping region. For example, the overlapping region of the second coating layer 152 may contact the lower surface of the first metal layer 131 of the second circuit pattern layer 130. Additionally, the non-overlapping region of the second coating layer 152 may not vertically overlap the second circuit pattern layer 130. For example, the second coating layer 152 may be formed entirely on the lower surface of the insulating layer 110. The second coating layer 152 may function to improve adhesion between the second circuit pattern layer 130 and the insulating layer 110. That is, the second coating layer 152 may also include a first functional group and a second functional group corresponding to the first coating layer 151.

Meanwhile, when the circuit board of the embodiment has a multi-layer structure, an additional lower insulating layer (not shown) may be disposed on the lower surface of the insulating layer 110. Additionally, the non-overlapping region (a region not in contact with the second circuit pattern layer) of the second coating layer 152 may be combined with the lower insulating layer, as a result, adhesion between the insulating layer 110 and the lower insulating layer can be improved.

Meanwhile, a third coating layer 153 may be formed on the inner wall of the through hole of the insulating layer 110. For example, the third coating layer 153 may be disposed between the inner wall of the through hole of the insulating layer 110 and the first metal layer 141 of the through electrode 140. The third coating layer 153 also includes first and second functional groups, corresponding to the first and second coating layers 151 and 152. Accordingly, the coating layer 150 can improve adhesion between the insulating layer 110 and the through electrode 140.

Hereinafter, the coating layer 150 will be described in detail.

The coating layer 150 may have a thickness of 100 nm or less. The coating layer 150 may have a thickness of 80 nm or less. The coating layer 150 may have a thickness of 50 nm or less. The coating layer 150 may have a thickness of 30 nm or less. Preferably, the coating layer 150 may have a thickness ranging from 5 nm to 25 nm.

If the thickness of the coating layer 150 is formed to be 5 nm or less, the thickness of the coating layer 150 is too thin, sufficient adhesion between the insulating layer 110 and the circuit pattern layers and the through electrode cannot be secured. In addition, if the thickness of the coating layer 150 exceeds 100 nm, the effect of improving adhesion according to thickness is minimal, and as a result, the overall thickness of the circuit board may increase. In addition, the dielectric constant of the insulating layer may increase, and application to circuit boards for high frequency applications may be difficult.

The coating layer 150 may include a plurality of elements.

A plurality of elements included in the coating layer 150 are combined with each other in the coating layer 150 and are included in molecular form or in ionic form, and the molecules and the ions may be chemically bonded to each other to form the coating layer 150.

As described above, the coating layer 150 includes first and second functional groups.

For example, the coating layer 150 may include at least one of oxygen, hydrogen, carbon, sulfur, and nitrogen. The oxygen element, hydrogen element, carbon element, sulfur element, and nitrogen element may be combined with each other within the coating layer 150 and exist in the form of molecules or in the form of individual ions.

Some of the plurality of elements included in the coating layer 150 may correspond to the first functional group of the coating layer 150 that is combined with the insulating layer 110. For example, the oxygen element, hydrogen element, and carbon element of the plurality of elements included in the coating layer 150 may correspond to the first functional group of the coating layer 150 combined with the insulating layer 110. For example, the first functional group of the coating layer 150 may chemically bond to the insulating layer 110.

In addition, the remaining portions of the plurality of elements included in the coating layer 150 may correspond to the second functional group of the coating layer 150 that combines with the first metal layer of the circuit pattern layers and the first metal layer of the through electrode, which is the chemical copper plating layer. For example, the nitrogen element and sulfur element contained in the coating layer 150 may correspond to the second functional group of the coating layer 150 that combines with the first metal layer of the circuit pattern layers and the first metal layer of the through electrode. For example, the second functional group of the coating layer 150 may chemically bond to the first metal layer of the circuit pattern layers and the first metal layer of the through electrode.

Meanwhile, the molecules included in the coating layer 150 may include at least two types of molecules depending on the size or molecular weight of the molecule. For example, the molecule may include macromolecules and unimolecular. For example, the macromolecules, the unimolecular, and metal ions within the coating layer 150 may have a structure in which they are chemically bonded to each other through covalent bonds and coordination bonds within the coating layer 150.

Meanwhile, the coating layer 150 includes a first functional group and a second functional group. In addition, the first functional group and the second functional group may be defined as terminal groups of the coating layer 150 that are connected to any one of the macromolecules, unimolecular, or metal atoms constituting the coating layer 150.

Referring to FIG. 4, the first functional group may be combined with the insulating layer 110. For example, the first functional group may hydrogen bond with the insulating layer 110. For example, the first functional group may be combined with a hydroxyl group (OH) of the insulating layer 110. For this purpose, the first functional group in the first embodiment may include a carboxyl group (COOH). The carboxyl group (COOH) of the coating layer 150 can hydrogen bond with the hydroxyl group (OH) of the insulating layer 110, thereby improving the adhesion between the coating layer 150 and the insulating layer 110.

Additionally, the second functional group may combine with the first metal layer. For example, the second functional group may coordinate with the first metal layers. For example, the second functional group may include an element that coordinates with the metal constituting the first metal layer. For example, the second functional group of the coating layer 150 may coordinate with copper constituting the first metal layer. Alternatively, the second functional group of the coating layer 150 may coordinate with a metal other than the copper constituting the first metal layer.

At this time, in the embodiment, the second functional group of the coating layer 150 is capable of coordinating with a catalyst metal used as a catalyst in a process of chemical copper plating of the first metal layer. Preferably, the second functional group in the embodiment may include an element capable of coordinating with palladium, which is a catalyst metal used as a catalyst in a plating process of forming the first plating layer by chemical copper plating. To this end, the second functional group in the first embodiment may include nitrogen (N). As an example, the second functional group may be NH2. And, in the embodiment, the adhesion between the coating layer 150 and the first metal layer can be further improved by allowing the second functional group to coordinate with the catalyst metal of the first metal layer.

In the first embodiment, the coating layer 150 includes a first functional group of carboxyl group (COOH) and a second functional group containing nitrogen (N). Accordingly, the embodiment can improve adhesion between the insulating layer 110 and the first metal layer.

Meanwhile, a structural formula of the material constituting the coating layer 150 in the first embodiment may be a first structural formula and a second structural formula below.

[First structural formula]

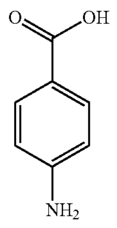

[second structural formula]

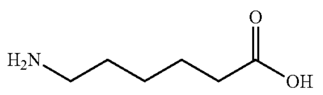

Meanwhile, candidate materials constituting the coating layer 150 in the first embodiment are not limited to the first and second structural formulas, and may include all materials containing a first functional group containing a carboxyl group (COOH) and a second functional group containing nitrogen (N).

Meanwhile, referring to FIG. 5, the first functional group may be combined with the insulating layer 110. For example, the first functional group may combine with a hydroxyl group (OH) of the insulating layer 110. For this purpose, the first functional group in the first embodiment may include $CH_3$. The $CH_3$ of the coating layer 150 may hydrogen bond with the hydroxyl group (OH) of the insulating layer 110, and accordingly, it can function to improve adhesion between the coating layer 150 and the insulating layer 110.

Additionally, the second functional group in the second embodiment may include the same nitrogen (N) as the second functional group in the first embodiment. That is, the second functional group in the second embodiment may include nitrogen (N) capable of coordinating with palladium, which is a catalyst metal of the first metal layer.

Meanwhile, a structural formula of the material constituting the coating layer 150 in the second embodiment may be a third structural formula below.

[Third strucural formula]

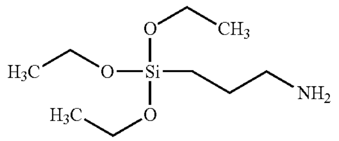

Meanwhile, candidate materials constituting the coating layer 150 in the second embodiment are not limited to the first and second structural formulas, and may include all materials containing a first functional group containing the $CH_3$ and a second functional group containing nitrogen (N).

Referring to FIG. 6, the first functional group of the coating layer 150 may be combined with the insulating layer 110. For example, the first functional group may hydrogen bond with the insulating layer 110. For example, the first functional group may be combined with a hydroxyl group (OH) of the insulating layer 110. For this purpose, the first functional group in the first embodiment may include a carboxyl group (COOH). The carboxyl group (COOH) of the coating layer 150 can hydrogen bond with the hydroxyl group (OH) of the insulating layer 110, thereby improving the adhesion between the coating layer 150 and the insulating layer 110.

Additionally, the second functional group enables coordination with the catalyst metal of the first metal layer. Preferably, the second functional group may coordinate with palladium, which is a catalyst metal used as a catalyst in the plating process of forming the first plating layer by chemical copper plating. To this end, the second functional group in the third embodiment may include sulfur (S). For example, the second functional group may be SH containing sulfur (S), but is not limited thereto.

In the third embodiment, the coating layer 150 includes a first functional group of a carboxyl group (COOH) and a second functional group containing sulfur (S). Accordingly, adhesion between the insulating layer 110 and the first metal layer can be improved.

Meanwhile, the structural formula of the material constituting the coating layer 150 in the third embodiment may be fourth to sixth structural formulas below.

[Fourth strucural formula]

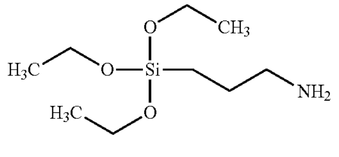

-continued

[Fifth strucural formula]

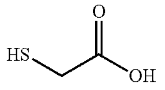

[Sixth strucural formula]

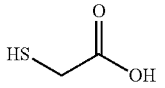

Meanwhile, the candidate materials constituting the coating layer 150 in the third embodiment are not limited to the fourth to sixth structural formulas, and may include all materials containing a first functional group containing a carboxyl group (COOH) and a second functional group containing sulfur (S).

Referring to FIG. 7, the first functional group of the coating layer 150 in the fourth embodiment may be combined with the insulating layer 110. For example, the first functional group may combine with a hydroxyl group (OH) of the insulating layer 110. For this purpose, the first functional group in the first embodiment may include $CH_3$. The $CH_3$ of the coating layer 150 may hydrogen bond with the hydroxyl group (OH) of the insulating layer 110. Accordingly, the $CH_3$ of the coating layer 150 can function to improve adhesion between the coating layer 150 and the insulating layer 110.

Additionally, the second functional group of the coating layer 150 may include sulfur (S). For example, the second functional group may be SH containing sulfur (S), but is not limited thereto.

The embodiment includes a coating layer disposed between the insulating layer and the circuit pattern layer. Specifically, the coating layer in the embodiment is disposed between the insulating layer and a first metal layer of the circuit pattern layer. The first metal layer may be a chemical copper plating layer. The coating layer includes a first functional group and a second functional group. The first functional group may be combined with the insulating layer, and the second functional group may be combined with the first metal layer. For example, the first functional group may include a carboxyl group (COOH) or $CH_3$ that combines with the hydroxyl group (OH) of the insulating layer 110. The second functional group includes at least one of nitrogen (N) and sulfur (S) that coordinates with palladium, which is a catalyst metal of the first metal layer. Accordingly, the embodiment can improve adhesion between the insulating layer and the circuit pattern layer by using the coating layer 150. Accordingly, reliability problems such as collapse of the circuit pattern layer or separation from the insulating layer can be solved. Furthermore, a line width of the trace constituting the circuit pattern layer can be further refined by improving the adhesion between the insulating layer and the first metal layer, thereby improving circuit integration.

Additionally, a first metal layer in the embodiment may have a thickness ranging from 1 um to 2.5 um. Preferably, the first metal layer may have a thickness ranging from 1.2 um to 2.3 um. Preferably, the first metal layer may have a thickness ranging from 1.4 um to 2.2 um. Through this, the embodiment can further improve the adhesion between the first metal layer and the insulating layer, and furthermore, the embodiment can improve adhesion between the insulating layer and the circuit pattern layer. Through this, the electrical reliability of the circuit pattern layer in the embodiment can be improved, and thus product satisfaction can be improved. In addition, the embodiment can improve the adhesion between the insulating layer and the circuit pattern layer and refine the line width of the trace constituting the circuit pattern layer. As a result, the circuit integration degree can be increased or the overall volume of the circuit board can be reduced.

Additionally, the centerline average roughness value (Ra) of the insulating layer in the embodiment may range between 200 nm and 600 nm. The centerline average roughness value (Ra) of the insulating layer may be 300 nm to 500 nm. Additionally, the maximum section height value (Rt) of the insulating layer may be 2 um to 6 um. For example, the maximum section height value (Rt) of the insulating layer may be 3 um to 5 um. At this time, the centerline average roughness value (Ra) and maximum section height value (Rt) of the insulating layer may be the centerline average roughness value (Ra) and maximum section height value (Rt) of the surface of the first metal layer in contact with the insulating layer. In an embodiment, the centerline average roughness value (Ra) or maximum section height value (Rt) may be controlled to correspond to the thickness of the first metal layer, and accordingly, the anchoring effect can be further improved as the thickness of the first metal layer increases. Furthermore, the embodiment can improve the plating thickness uniformity of the first metal layer by controlling the centerline average roughness value (Ra) and maximum section height value (Rt). Furthermore, when the first metal layer is etched, a portion of the first metal layer is prevented from remaining on the surface of the insulating layer, thereby improving the electrical reliability of the circuit board and improving the yield of the circuit board.

FIG. 8 is a diagram showing analysis results of a coating layer according to an embodiment, and FIG. 9 is a diagram for comparing adhesion between an insulating layer and a circuit pattern layer according to comparative examples and embodiments Referring to FIG. 8, the embodiment forms a coating layer containing a first functional group and a second functional group, and it was confirmed that the detection amount of the combined mass of the N component increased. Specifically, FIG. 8 shows analysis results of time of flight secondary ion mass spectrometry (TOF-SIMS) according to negative ion mode after forming the coating layer 150. As in the graphs of the embodiment 1 and the embodiment 2 in FIG. 8, it was confirmed that the detection amount of the combined mass of N components such as CN− and C2N3− in the embodiment according to the negative ion results increased. Accordingly, it was confirmed that the bonding of CN+ and the bonding of C2N3+ increased through the coating layer 150 in the embodiment.

Meanwhile, as shown in FIG. 9(*a*), in the comparative example, the adhesion between the trace and the insulating layer decreases as the line width of the trace decreases, and accordingly, it was confirmed that reliability problems such as trace separation occurred in some regions. In FIG. 9, W1 means that the line width of the trace is 17 um, W2 means that the line width of the trace is 15 um, W3 means that the line width of the trace is 13 um, W4 means that the line width of the trace is 11 um, W5 means that the line width of the trace is 9 um, W6 means that the line width of the trace is 7 um, and W7 means that the line width of the trace is 5 um.

For example, in the comparative example, it was confirmed that traces in some regions were separated at a line width of 7 um (W6) and thus did not remain on the insulating layer.

Unlike this, the embodiment may secure adhesion between the insulating layer 110 and the circuit pattern layers by disposing the coating layer 150 between the insulating layer 110 and the circuit pattern layer 120. Furthermore, the embodiment can secure adhesion between the insulating layer 110 and the circuit pattern layers by increasing the thickness of the first metal layer constituting the circuit pattern layer compared to the comparative example.

Through this, as shown in (b) of FIG. 9, it was confirmed that the embodiment was stably placed on the insulating layer even if the line width of the trace of the circuit pattern layer was refined to 10 um or less.

Specifically, the difference in adhesion between the embodiment and the comparative example is shown in Table 5 below.

In Table 5 below, the embodiment refers to a state in which the coating layer 150 is disposed on resins having different characteristics (embodiment 1 and embodiment 2), and comparative examples refer to a state in which the coating layer is not disposed (comparative example 1 and comparative example 2). In addition, Table 5 shows the measured adhesion values according to the line width of the trace based on the state described above.

TABLE 5

| | adhesion (trace shear, gf) | | | | | | |
|---|---|---|---|---|---|---|---|
| Line width of trace | 5 um | 7 um | 9 um | 11 um | 13 um | 15 um | 17 um |
| comparative example 1 | 6.1 | 7.9 | 10.6 | 13.4 | 14.8 | 17.3 | 19.3 |
| comparative example 2 | 10.5 | 13.5 | 15.3 | 18.5 | 20.9 | 24.2 | 27.0 |
| embodiment 1 | 8.4 | 9.8 | 12.2 | 14.3 | 17.2 | 19.8 | 22.4 |
| embodiment 2 | 13.4 | 14.7 | 17.0 | 19.5 | 22.7 | 25.5 | 27.9 |

As shown in Table 5, when the coating layer 150 was included as in the embodiment, it was confirmed that the adhesion between the insulating layer and the circuit pattern layer increased without being affected by the line width of the trace compared to the comparative example.

Manufacturing Method

Hereinafter, a method of manufacturing a circuit board according to an embodiment will be described.

FIGS. 10 to 18 are diagrams showing a method of manufacturing a circuit board according to an embodiment in order of processes.

Referring to FIG. 10, in the embodiment, an insulating member that is the basis for manufacturing a circuit board is prepared. Preferably, in the embodiment, RCC (resin coated copper) may be prepared. For example, the insulating member may include an insulating layer 110 including resin and filler 111, and a copper foil layer 200 attached to the insulating layer 110.

Next, referring to FIG. 11, the embodiment may proceed with a process of processing the insulating member to form a through hole (TH) passing through the insulating member.

Next, referring to FIG. 12, in the embodiment, a process of removing the copper foil layer 200 may be performed to form a circuit pattern layer using the SAP method.

Next, referring to FIG. 13, the embodiment may proceed with a process of forming a coating layer 150 on the insulating layer 110. Specifically, the embodiment may proceed with a process of coating the coating layer 150 including a first functional group bonded to the insulating layer 110 and a second functional group bonded to the first metal layer. Meanwhile, the coating layer 150 may be formed on the insulating layer 110 using a method other than a coating method.

The coating layer 150 includes a first coating layer 151 disposed on the upper surface of the insulating layer 110, a second coating layer 152 disposed on the lower surface of the insulating layer 110, and a third coating layer 153 disposed on the inner wall of the through hole (TH) of the insulating layer 110.

Next, referring to FIG. 14, the embodiment may proceed with a process of forming a first metal layer. For example, the embodiment may proceed with a process of forming first metal layers 121, 131, and 141 on the first coating layer 151, the second coating layer 152, and the third coating layer 153, respectively.

At this time, the first metal layers 121, 131, and 141 may have a thickness ranging from 1 um to 2.5 um. Preferably, the first metal layers 121, 131, and 141 may have a thickness ranging from 1.2 um to 2.3 um. Preferably, the first metal layers 121, 131, and 141 may have a thickness ranging from 1.4 um to 2.2 um.

Next, referring to FIG. 15, the embodiment may proceed with a process of forming a dry film on the first metal layers 121, 131, and 141.

For example, the embodiment may proceed with a process of stacking a first dry film (DF1) including a first opening (OR1) that vertically overlaps the region where the first circuit pattern layer 120 will be disposed, and a process of laminating a second dry film (DF2) including a second opening (OR2) that vertically overlaps the region where the second circuit pattern layer 130 will be disposed.

Next, referring to FIG. 16, the embodiment may proceed with a process of electroplating the first metal layers 121, 131, and 141 as a seed layer to form second metal layers 122, 132 and 142 that fill the openings (OR1 and OR2) of the dry films (DF1 and DF2).

Next, referring to FIG. 17, the embodiment may proceed with a process of removing the dry films DF1 and DF2.

Next, referring to FIG. 18, the embodiment may proceed with a process of removing the first metal layers 121, 131, and 141 that do not vertically overlap the second metal layers 122, 132, and 142. Accordingly, the embodiment may form a first circuit pattern layer 120, a second circuit pattern layer 130, and a through electrode 140 each including a first metal layer and a second metal layer.

Multilayer Circuit Board

FIG. 19 is a diagram showing a multilayer circuit board according to the first embodiment.

Referring to FIG. 19, the circuit board may include an insulating substrate including first to third insulating parts 310, 320, and 330, a circuit pattern layer 340, and a through electrode 350.

The insulating substrate including the first to third insulating parts 310, 320, and 330 may have a flat structure. The insulating substrate may be PCB. Here, the insulating substrate may be implemented as a single substrate, or alternatively, may be implemented as a multilayer substrate in which a plurality of insulating layers are sequentially stacked.

Accordingly, the insulating substrate may include a plurality of insulating parts 310, 320, and 330. As shown in FIG. 19, a plurality of insulating parts include a first insulating part 310, a second insulating part 320 disposed on the first insulating part 310, and a third insulating part 330 below the first insulating part 310.

The first insulating part 310, the second insulating part 320, and the third insulating part 330 may include different insulating materials. Preferably, the first insulating part 310 may include glass fiber. Also, the second insulating part 320 and the third insulating part 330 may not include glass fibers, unlike the first insulating part 310. Preferably, the second insulating part 320 and the third insulating part 330 may include the RCC shown in FIG. 3.

Accordingly, a thickness of each insulating layer constituting the first insulating part 310 may be different from a thickness of each insulating layer constituting the second insulating part 320 and the third insulating part 330. In other words, the thickness of each insulating layer constituting the first insulating part 310 may be greater than the thickness of each insulating layer constituting the second insulating part 320 and the third insulating part 330.

That is, the first insulating part 310 includes glass fiber, and the glass fiber generally has a thickness of 12 um. Accordingly, the thickness of each insulating layer constituting the first insulating part 310 includes the glass fiber and may range from 19 um to 23 um.

In contrast, the second insulating part 320 does not include glass fiber. Preferably, each insulating layer constituting the second insulating part 320 may be composed of RCC.

Additionally, the third insulating part 330 does not include glass fiber. Preferably, each insulating layer constituting the third insulating part 330 may be RCC.

That is, the insulating part constituting the circuit board in the comparative example includes a plurality of insulating layers, and the plurality of insulating layers are all composed of prepreg containing glass fiber. At this time, it is difficult to reduce the thickness of the glass fiber in the circuit board of the comparative example based on the prepreg. This is because the glass fibers included in the prepreg may come into contact with the circuit pattern layer disposed on the surface of the prepreg when the thickness of the prepreg decreases, resulting in a risk of cracking. Accordingly, when reducing the thickness of the prepreg, the circuit board in the first comparative example may have suffered dielectric breakdown and damage to the circuit pattern layer. Accordingly, the circuit board in the comparative example had a limit in reducing the overall thickness due to the thickness of the glass fibers constituting the prepreg.

Additionally, the circuit board in the comparative example has a high dielectric constant because it is composed of an insulating layer made only of prepreg containing glass fiber. However, in a case of dielectrics with high dielectric constants, it is difficult to approach them as a high-frequency substitute. That is, because the circuit board in the comparative example has a high dielectric constant of glass fiber, a phenomenon in which the dielectric constant is destroyed in the high frequency band occurs.

Accordingly, the embodiment allows at least some of the layers in the multilayer circuit board to include the RCC shown in FIG. 3. Accordingly, it is possible to minimize signal loss even in a high frequency band while slimming the thickness of the circuit board, and furthermore, it is possible to provide a highly reliable circuit board with improved adhesion between the circuit pattern layer and the insulating layer.

The first insulating part 310 may include a first insulating layer 311, a second insulating layer 312, a third insulating layer 313, and a fourth insulating layer 314 from below. In addition, glass fiber may be included in each of the first insulating layer 311, the second insulating layer 312, the third insulating layer 313, and the fourth insulating layer 314. For example, the first insulating layer 311, the second insulating layer 312, the third insulating layer 313, and the fourth insulating layer 314 may each include prepreg.

Meanwhile, the insulating substrate in the embodiment of the present application may be composed of 8 layers based on the insulating layer. However, the embodiment is not limited thereto, and the total number of layers of the insulating layer may be increased or decreased.

Additionally, in the first embodiment, the first insulating part 310 may be composed of four layers. For example, in the first embodiment, the first insulating part 310 may be composed of four layers of prepreg.

Additionally, the second insulating part 320 may include a fifth insulating layer 321 and a sixth insulating layer 322 from below. The fifth insulating layer 321 and the sixth insulating layer 322 constituting the second insulating part 320 may include RCC.

Additionally, the third insulating part 330 may include a seventh insulating layer 331 and an eighth insulating layer 332 from above. The seventh insulating layer 331 and the eighth insulating layer 332 constituting the third insulating part 330 may include RCC.

Accordingly, the circuit pattern layers disposed on the second insulating part 320 and the third insulating part 330 may have a structure corresponding to the first and second circuit pattern layers shown in FIG. 3.

That is, the circuit pattern layer 340 may be disposed on a surface of the insulating layer constituting each of the first insulating part 310, the second insulating part 320, and the third insulating part 330.

Preferably, a circuit pattern layer 340 may be disposed on at least one surface of the first insulating layer 311, the second insulating layer 312, the third insulating layer 313, the fourth insulating layer 314, the fifth insulating layer 321, the sixth insulating layer 322, the seventh insulating layer 331 and the eighth insulating layer 332.

At least one through electrode 350 is formed in at least one of the plurality of insulating layers constituting the first insulating part 310, the second insulating part 320, and the third insulating part 330. The through electrode 350 is disposed to pass through at least one insulating layer among the plurality of insulating layers. The through electrode 350 may pass through only one insulating layer among the plurality of insulating layers. Alternatively, the through electrode 350 may be formed to commonly pass through at least two insulating layers among the plurality of insulating layers. Accordingly, the through electrode 350 electrically connects circuit patterns disposed on surfaces of different insulating layers to each other.

FIG. 20 is a diagram showing a multilayer circuit board according to a second embodiment, and FIG. 21 is a diagram showing a multilayer circuit board according to a third embodiment.

Referring to FIGS. 20 and 21, the circuit board is a difference in the number of layers of the first insulating part made of PPG, the second insulating part and the third insulating part made of RCC in the overall laminated structure of the insulating substrate.

Referring to FIG. 20, the circuit board in the second embodiment includes a first insulating part 310*a*, a second insulating part 320*a*, and a third insulating part 330*a*.

And, the first insulating part 310*a* may include two layers of prepreg 311*a* and 312*a*.

Additionally, the second insulating part 320*a* may include three layers of RCCs 321*a*, 322*a*, and 323*a*.

Additionally, the third insulating part 330*a* may include three layers of RCCs 331*a*, 332*a*, and 333*a*.

Referring to FIG. 21, the circuit board in the third embodiment may include only one insulating part 310*b*. And, the insulating part 310*b* may have an 8-layer structure.

Additionally, the insulating part 310*b* may all include RCCs 311*b*, 312*b*, 313*b*, 314*b*, 315*b*, 316*b*, 317*b* and 318*b*.

Semiconductor Package

FIG. 22 is a diagram showing a semiconductor package according to an embodiment.

Referring to FIG. 22, a semiconductor package may include at least one multilayer substrate of FIGS. 19 to 21. In one embodiment, the multilayer substrate may be a package substrate. In another embodiment, multilayer substrate may be a connection substrate disposed on the package substrate. For example, the connection substrate may include an interposer.

The multilayer circuit board constituting the semiconductor package includes a first insulating part 410 including a plurality of insulating layers 411, 412, 413, and 414, a second insulating part 420 including a plurality of insulating layers 421 and 422, and a third insulating part 430 including a plurality of insulating layers 431 and 432. In addition, the second insulating part 420 and the third insulating part 430 may include RCC, and first and second circuit pattern layers as shown in FIG. 3 may be disposed on surfaces of the second insulating part 420 and the third insulating part 430.

Meanwhile, the semiconductor package includes a first protective layer SR1 disposed on an uppermost insulating layer and a second protective layer SR2 disposed on a lowermost insulating layer.

Additionally, the semiconductor package includes a connection part 500 disposed on a circuit pattern layer disposed on an uppermost side. The connection part 500 may be a solder ball, but is not limited thereto.

Additionally, the semiconductor package may include a chip 600 attached to the connection part 500.

The chip 600 may be a processor chip. For example, the chip 600 may be an application processor (AP) chip of a central processor (e.g., CPU), a graphics processor (e.g., GPU), a digital signal processor, an encryption processor, a microprocessor, or a microcontroller.

In addition, although not shown in the drawing, the semiconductor package of the embodiment may further include an additional chip. For example, in an embodiment, at least two chips of a central processor (e.g., CPU), a graphics processor (e.g., GPU), digital signal processor, an encryption processor, a microprocessor, and a microcontroller may be disposed separately on the circuit board at a regular distance. For example, the chip 600 in the embodiment may include a central processor chip and a graphics processor chip, but is not limited thereto.

Meanwhile, the plurality of chips may be spaced apart from each other at a predetermined distance on the circuit board. For example, the distance between the plurality of chips may be 150 μm or less. For example, the distance between the plurality of chips may be 120 μm or less. For example, the distance between the plurality of chips may be 100 μm or less.

Preferably, the distance between the plurality of chips may range from 60 um to 150 um. Preferably, the distance between the plurality of chips may range from 70 um to 120 um. Preferably, the distance between the plurality of chips may range from 80 um to 110 um. If the distance between the plurality of chips is less than 60 μm, problems with operation reliability may occur due to mutual interference between the plurality of chips. If the distance between the plurality of chips is greater than 150 μm, signal transmission loss may increase as the distance between the plurality of chips increases. If the distance between the plurality of chips is greater than 150 μm, the volume of the semiconductor package may increase.

The embodiment includes a coating layer disposed between the insulating layer and the circuit pattern layer. Specifically, the coating layer in the embodiment is disposed between the insulating layer and a first metal layer of the circuit pattern layer. The first metal layer may be a chemical copper plating layer. The coating layer includes a first functional group and a second functional group. The first functional group may be combined with the insulating layer, and the second functional group may be combined with the first metal layer. For example, the first functional group may include a carboxyl group (COOH) or $CH_3$ that combines with the hydroxyl group (OH) of the insulating layer 110. The second functional group includes at least one of nitrogen (N) and sulfur (S) that coordinates with palladium, which is a catalyst metal of the first metal layer. Accordingly, the embodiment can improve adhesion between the insulating layer and the circuit pattern layer by using the coating layer 150. Accordingly, reliability problems such as collapse of the circuit pattern layer or separation from the insulating layer can be solved. Furthermore, a line width of the trace constituting the circuit pattern layer can be further refined by improving the adhesion between the insulating layer and the first metal layer, thereby improving circuit integration.

Additionally, a first metal layer in the embodiment may have a thickness ranging from 1 um to 2.5 um. Preferably, the first metal layer may have a thickness ranging from 1.2 um to 2.3 um. Preferably, the first metal layer may have a thickness ranging from 1.4 um to 2.2 um. Through this, the embodiment can further improve the adhesion between the first metal layer and the insulating layer, and furthermore, the embodiment can improve adhesion between the insulating layer and the circuit pattern layer. Through this, the electrical reliability of the circuit pattern layer in the embodiment can be improved, and thus product satisfaction can be improved. In addition, the embodiment can improve the adhesion between the insulating layer and the circuit pattern layer and refine the line width of the trace constituting the circuit pattern layer. As a result, the circuit integration degree can be increased or the overall volume of the circuit board can be reduced.

Additionally, the centerline average roughness value (Ra) of the insulating layer in the embodiment may range between 200 nm and 600 nm. The centerline average roughness value (Ra) of the insulating layer may be 300 nm to 500 nm. Additionally, the maximum section height value (Rt) of the insulating layer may be 2 um to 6 um. For example, the maximum section height value (Rt) of the insulating layer may be 3 um to 5 um. At this time, the centerline average roughness value (Ra) and maximum section height value (Rt) of the insulating layer may be the centerline average roughness value (Ra) and maximum section height value (Rt) of the surface of the first metal layer in contact with the insulating layer. In an embodiment, the centerline average roughness value (Ra) or maximum section height value (Rt) may be controlled to correspond to the thickness of the first metal layer, and accordingly, the anchoring effect can be further improved as the thickness of the first metal layer increases. Furthermore, the embodiment can improve the plating thickness uniformity of the first metal layer by controlling the centerline average roughness value (Ra) and maximum section height value (Rt). Furthermore, when the first metal layer is etched, a portion of the first metal layer is prevented from remaining on the surface of the insulating layer, thereby improving the electrical reliability of the circuit board and improving the yield of the circuit board.

The characteristics, structures and effects described in the embodiments above are included in at least one embodiment but are not limited to one embodiment. Furthermore, the characteristics, structures, and effects and the like illustrated in each of the embodiments may be combined or modified even with respect to other embodiments by those of ordinary skill in the art to which the embodiments pertain. Thus, it should be construed that contents related to such a combination and such a modification are included in the scope of the embodiment.

The above description has been focused on the embodiment, but it is merely illustrative and does not limit the embodiment. A person skilled in the art to which the embodiment pertains may appreciate that various modifications and applications not illustrated above are possible without departing from the essential features of the embodiment. For example, each component particularly represented in the embodiment may be modified and implemented. In addition, it should be construed that differences related to such changes and applications are included in the scope of the embodiment defined in the appended claims.

What is claimed is:

1. A circuit board comprising:

a first insulating layer including a through hole passing through an upper surface and a lower surface opposite to the upper surface;

a coating layer disposed on an inner wall of the through hole of the first insulating layer; and a through electrode disposed to fill the through hole on the coating layer, wherein the through electrode layer includes:

a first metal layer disposed on the coating layer; and a second metal layer disposed on the first metal layer, wherein the coating layer includes:

a first functional group bonded to the first insulating layer; and a second functional group bonded to the first metal layer, wherein the first insulating layer includes a hydroxyl (OH) group, and wherein the first functional group of the coating layer includes at least one of a carboxyl group (COOH) and $CH_3$ bonded to the hydroxyl group, and wherein the second functional group of the coating layer includes at least one of nitrogen (N) and sulfur (S) coordinated with the first metal layer.

2. The circuit board of claim 1, wherein:

the first metal layer is an electroless plating layer, and the second metal layer is an electrolytic plating layer formed with the first metal layer as a seed layer.

3. The circuit board of claim 2, wherein the second functional group of the coating layer coordinates with a catalyst metal of the first metal layer.

4. The circuit board of claim 3, wherein:

the catalyst metal of the first metal layer includes palladium, and at least one of nitrogen (N) and sulfur (S) of the second functional group of the coating layer coordinates with the palladium.

5. The circuit board of claim 1, wherein the first metal layer has a thickness ranging between 1 um and 2.5 um.

6. The circuit board of claim 5, wherein a centerline average roughness value (Ra) of a surface of the first metal layer satisfies a range between 200 nm and 600 nm, and wherein a maximum section height value (Rt) of the surface of the first metal layer satisfies a range between 2 um and 6 um.

7. The circuit board of claim 1, further comprising:

a circuit pattern layer disposed on the first insulating layer, wherein the coating layer further includes a region extending from a portion disposed on the inner wall of the through hole and disposed between the first insulating layer and the circuit pattern layer.

8. The circuit board of claim 7, wherein the circuit pattern layer includes:

a third metal layer disposed on the region of the coating layer; and a fourth metal layer disposed on the third metal layer.

9. The circuit board of claim 8, wherein the region of the coating layer in contact with the third metal layer includes:

a first functional group including at least one of a carboxyl group (COOH) and $CH_3$ bonded to a hydroxyl group, and at least one second functional group of nitrogen (N) and sulfur (S) that coordinates with a catalyst metal of the third metal layer.

10. The circuit board of claim 8, wherein the region of the coating layer includes:

an overlapping region vertically overlapping the circuit pattern layer; and a non-overlapping region excluding the overlapping region.

11. The circuit board of claim 10, further comprising:

a second insulating layer disposed on the first insulating layer, and wherein the overlapping region of the coating layer is in contact with the circuit pattern layer, and wherein the non-overlapping region of the coating layer is in contact with the second insulating layer.

12. A semiconductor package comprising:

an insulating layer having a through hole passing through an upper surface and a lower surface opposite to the upper surface;

a coating layer including a first portion disposed on the upper surface of the insulating layer and a second portion disposed on an inner wall of the through hole;

a circuit pattern layer disposed on the first portion of the coating layer; and a through electrode disposed on the second portion of the coating layer to fill the through hole, wherein the circuit pattern layer and the through electrode includes:

a first metal layer disposed on the first and second portions of the coating layer; and a second metal layer disposed on the first metal layer, and wherein the coating layer includes:

a first functional group bonded to the first insulating layer; and a second functional group bonded to the first metal layer, wherein the first insulating layer includes a hydroxyl (OH) group, and wherein the first functional group of the coating layer includes at least one of a carboxyl group (COOH) and $CH_3$ bonded to the hydroxyl group, and wherein the second functional group of the coating layer includes at least one of nitrogen (N) and sulfur (S) coordinated with the first metal layer.

13. The semiconductor package of claim 12, wherein the second functional group of the coating layer coordinates with a catalyst metal of the first metal layer.

14. The semiconductor package of claim 13, wherein the catalyst metal of the first metal layer includes palladium, and wherein at least one of nitrogen (N) and sulfur (S) of the second functional group of the coating layer is coordinated with the palladium.

* * * * *